(12) United States Patent
Baba et al.

(10) Patent No.: US 8,729,709 B2
(45) Date of Patent: May 20, 2014

(54) SEMICONDUCTOR DEVICE

(75) Inventors: Shinji Baba, Kanagawa (JP); Toshihiro Iwasaki, Kanagawa (JP); Masaki Watanabe, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 245 days.

(21) Appl. No.: 13/005,322

(22) Filed: Jan. 12, 2011

(65) Prior Publication Data

US 2011/0169170 A1    Jul. 14, 2011

(30) Foreign Application Priority Data

Jan. 14, 2010    (JP) .................................. 2010-005403

(51) Int. Cl.
*H01L 23/48*    (2006.01)

(52) U.S. Cl.
USPC ...... 257/774; 257/686; 257/778; 257/E23.01; 361/748; 361/760; 361/767; 361/772; 361/777; 361/803

(58) Field of Classification Search
USPC ............ 257/686, 774, 778, E23.01; 361/748, 361/760, 767, 772, 777, 780, 803
See application file for complete search history.

(56) References Cited

U.S. PATENT DOCUMENTS

| | | | |
|---|---|---|---|
| 6,528,734 B2 | 3/2003 | Mizunashi | |
| 6,941,537 B2 * | 9/2005 | Jessep et al. | 716/137 |
| 2005/0098886 A1 * | 5/2005 | Pendse | 257/738 |
| 2006/0044735 A1 | 3/2006 | Hayashi et al. | |

FOREIGN PATENT DOCUMENTS

| | | |
|---|---|---|
| JP | 10-065300 A | 3/1998 |
| JP | 11-145328 A | 5/1999 |
| JP | 2002-299512 A | 10/2002 |
| JP | 2006-073622 | 3/2006 |
| JP | 2008-047710 A | 2/2008 |
| JP | 2009-032918 A | 2/2009 |

OTHER PUBLICATIONS

Office Action issued in Japanese Patent Application No. 2010-005403 dated Apr. 2, 2013.

* cited by examiner

*Primary Examiner* — Peniel M Gumedzoe
(74) *Attorney, Agent, or Firm* — McDermott Will & Emery LLP

(57) ABSTRACT

This invention provides a multi-pin semiconductor device as a low-cost flip-chip BGA. In the flip-chip BGA, a plurality of signal bonding electrodes in a peripheral area of the upper surface of a multilayer wiring substrate are separated into inner and outer ones and a plurality of signal through holes coupled to a plurality of signal wirings drawn inside are located between a plurality of rows of signal bonding electrodes and a central region where a plurality of bonding electrodes for core power supply are located so that the chip pad pitch can be decreased and the cost of the BGA can be reduced without an increase in the number of layers in the multilayer wiring substrate.

14 Claims, 28 Drawing Sheets

FIG. 14

| I/O ARRANGEMENT | NO. OF SIGNAL PAD ROWS | SGINAL PAD PITCH | CORED SUBSTRATE | CORELESS SUBSTRATE |
|---|---|---|---|---|
| AREA ARRAY ARRANGEMENT | 4 ROWS | 64um | 4 LAYERS | 3 LAYERS |
| | 6 ROWS | 43um | 6 LAYERS | 4 LAYERS |
| | 8 ROWS A | 32um B | 8 LAYERS | 4 LAYERS |
| | 10 ROWS | 26um | 8 LAYERS | 6 LAYERS |
| | 12 ROWS | 21um | 8 LAYERS | 6 LAYERS |
| PERIPHERAL ARRANGEMENT | 1 ROW | 40um | 4 LAYERS | 3 LAYERS |
| | 2 ROWS | 20um C | 8 LAYERS | 4 LAYERS D |

SEMICONDUCTOR DEVICE

CROSS-REFERENCE TO RELATED APPLICATIONS

The disclosure of Japanese Patent Application No. 2010-5403 filed on Jan. 14, 2010 including the specification, drawings and abstract is incorporated herein by reference in its entirety.

FIELD OF THE INVENTION

The present invention relates to semiconductor devices and more particularly to technology for a semiconductor device including a semiconductor chip flip-chip coupled to a wiring substrate.

BACKGROUND OF THE INVENTION

A semiconductor device having a multilayer substrate is disclosed in which a plurality of connecting terminals to which bumps for connection of an LSI chip are fixed are exposed on one outermost layer of the multilayer substrate and solder balls are fixed over metal pads on the other outermost layer to make up a ball grid array (BGA) structure for connection to a motherboard (for example, see Japanese Unexamined Patent Publication No. 2006-73622).

SUMMARY OF THE INVENTION

In recent years, in the category of multi-pin semiconductor devices (semiconductor packages), demand for smaller semiconductor chips (shrinkage in size) has been growing for the purpose of cost reduction. This demand is based on the idea that the number of semiconductor chips obtained from a single wafer should be increased by shrinkage in the size of each semiconductor chip (hereinafter called simply "chip") in order to reduce the cost of multi-pin semiconductor devices.

When priority is given to the multi-pin structure or package size, the BGA (ball grid array) substrate type is selected rather than the lead frame type. In this case, the wiring substrate used here is often a multilayer substrate because of the multi-pin structure. In addition, in the case of multi-pin semiconductor devices, package size depends on the number of pins, so if the chip is shrunk and the number of pins remains unchanged, the interval between pads (pad pitch) should be smaller. This may raise a problem that wirings cannot pass between pads.

In other words, for a multi-pin semiconductor device, chip shrinkage may pose a problem that the pad pitch is too small for wirings to pass between pads.

On the other hand, if the number of pads is increased due to the multi-pin structure and the number of layers of the multilayer substrate is unchanged, the problem may be somewhat relieved by area arrangement (central arrangement) of pads. However, if that is the case, signal wirings to be coupled to signal pads located on the periphery of the main surface of the chip must be drawn inside (toward the center of the chip) and coupled via through holes to another layer and drawn out from the other layer.

Generally, in a semiconductor chip with a larger number of pads, a multilayer wiring substrate is used and area arrangement of pads is adopted. For example, in some multilayer wiring substrates, a total of six wiring layers, three above the core layer and three below it, are formed by a build-up technique or the like and area arrangement of chip pads is also adopted.

However, in the case of multi-pin semiconductor devices, since core power supply bonding electrodes are densely arranged near the chip center, it is not easy to provide space for through holes for electrical coupling to the signal wirings drawn inside in the multilayer wiring substrate.

Therefore, for the multi-pin structure, the number of layers of the multilayer wiring substrate must be increased to arrange wirings properly. This would lead to rise in semiconductor device cost.

Furthermore, when the chip size is reduced, the pad pitch should be decreased, maybe making it difficult for wirings to pass between pads as mentioned above. Thus the problem here is that area arrangement of pads is impossible. On the other hand, though the use of the redistribution technique makes it possible to adopt area arrangement of pads, it involves difficulty in design and necessitates a chip cost increase. Since a rise in the chip cost leads to a rise in the semiconductor device cost, it is not a good solution.

The BGA semiconductor device described in the above patent document also has a problem that if the number of pins is to be increased, the number of wiring layers of the multilayer substrate must be increased, leading to a rise in the semiconductor device cost.

The present invention has been made in view of the above problem and an object thereof is to provide a technique which reduces the cost of multi-pin semiconductor devices.

Another object of the invention is to provide a technique which enables area arrangement of pads in a semiconductor device with a shrunk chip.

The above and further objects and novel features of the invention will more fully appear from the following detailed description in this specification and the accompanying drawings.

Typical aspects of the present invention which are disclosed herein are briefly outlined below.

According to one aspect of the present invention, a semiconductor device which uses a multilayer wiring substrate having an upper surface and a lower surface opposite to the upper surface with a semiconductor chip flip-chip mounted on the upper surface includes the semiconductor chip having a main surface and a back surface opposite to the main surface with a plurality of electrode pads formed on the main surface, the multilayer wiring substrate in which a plurality of bonding electrodes are formed in a plurality of rows on the upper surface in a first region corresponding to a peripheral area of the main surface of the semiconductor chip and an array of fixed potential (power supply and GND) bonding electrodes are formed in a second region inside the first region, and a plurality of external terminals provided on the lower surface of the multilayer wiring substrate. Here, a plurality of signal bonding electrodes among the bonding electrodes in the first region of the upper surface of the multilayer wiring substrate are separated into inner and outer ones; each of a plurality of signal wirings drawn inside from the signal bonding electrodes is electrically coupled to an wiring portion in another wiring layer through a through hole; and the through holes are located between the first region and the second region.

According to another aspect of the invention, a semiconductor device which uses a multilayer wiring substrate having an upper surface and a lower surface opposite to the upper surface with a semiconductor chip flip-chip mounted on the upper surface includes the semiconductor chip having a main surface and a back surface opposite to the main surface with a plurality of electrode pads formed on the main surface, the multilayer wiring substrate in which a plurality of bonding electrodes are formed in two rows on the upper surface in a first region corresponding to a peripheral area of the main surface of the semiconductor chip and an array of fixed potential (power supply and GND) bonding electrodes are formed in a second region inside the first region, and a plurality of external terminals provided on the lower surface of the multilayer wiring substrate. Here, a plurality of signal bonding electrodes among the bonding electrodes in the first region of the upper surface of the multilayer wiring substrate are separated into inner and outer ones; each of a plurality of signal wirings drawn inside from the signal bonding electrodes is electrically coupled to an wiring portion in another wiring layer through a through hole; and the through holes are located between the first region and the second region.

The advantageous effect achieved by preferred embodiments of the invention is briefly outlined below.

In a multi-pin semiconductor device, the chip can be shrunk without the need for an increase in the number of layers in its multilayer wiring substrate, so that the cost of the semiconductor device can be reduced.

In a multi-pin semiconductor device with a shrunk chip, area arrangement of semiconductor chip pads is possible.

BRIEF DESCRIPTION OF THE DRAWINGS

FIG. 14 shows data on the relation between pad arrangement type and substrate structure type in the semiconductor chip mounted in the semiconductor device shown in FIG. 1;

DETAILED DESCRIPTION OF THE PREFERRED EMBODIMENTS

Figure 1:
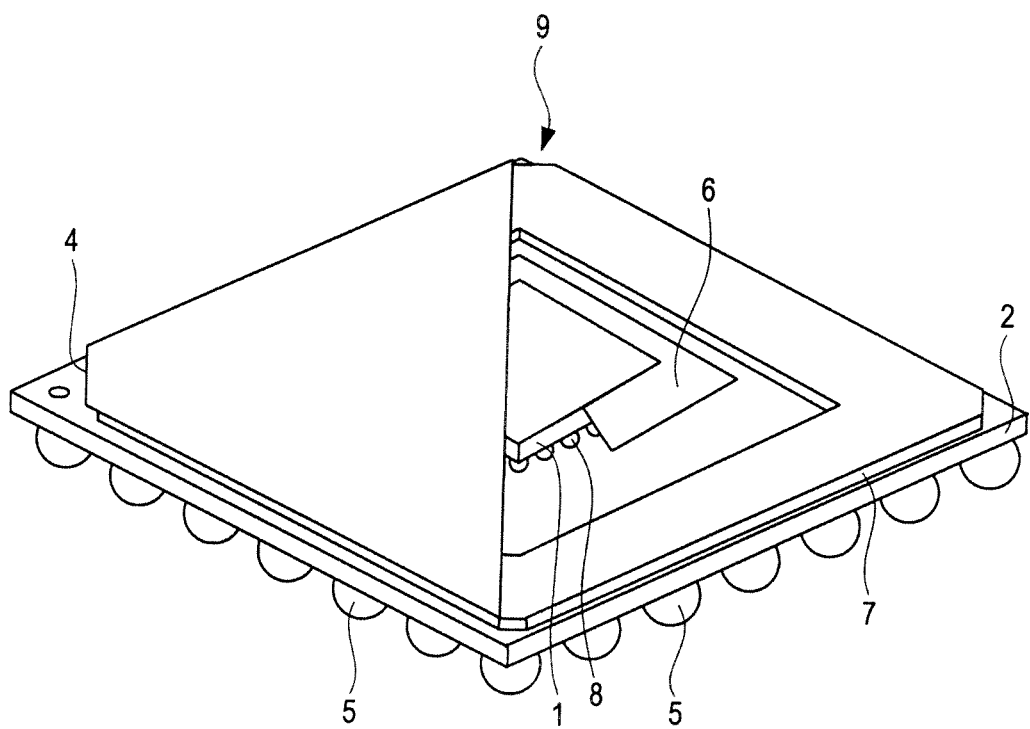
FIG. 1 is a partially broken perspective view of the structure of a semiconductor device according to a first embodiment of the invention.

In connection with the preferred embodiments described below, the same or similar explanations will not be repeated except when necessary.

Descriptions of the preferred embodiments will be made below separately or in different sections as necessary, but such descriptions are not irrelevant to each other unless otherwise specified. One description may be, in whole or in part, a variation or a detailed or supplementary form of another.

Also, in the preferred embodiments described below, even when a numerical datum for an element (the number of pieces, numerical value, quantity, range, etc.) is indicated by a specific numerical value, it is not limited to the specific numerical value unless otherwise specified or theoretically limited to that numerical value; it may be larger or smaller than the specific numerical value.

In the preferred embodiments described below, it is needles to say that their constituent elements (including constituent steps) are not necessarily essential unless otherwise specified or theoretically essential.

In the preferred embodiments described below, when an element is described as "comprising A" or "having A" or "including A", a component other than A is not excluded unless it is explicitly stated that the element only includes A or otherwise specified.

Similarly, in the preferred embodiments described below, when a specific form or positional relation is indicated for an element, it should be interpreted to include a form or positional relation which is virtually equivalent or similar to the specific form or positional relation unless otherwise specified or unless it should be theoretically limited to the specific form or positional relation. The same can be said of numerical values or ranges as mentioned above.

Next, the preferred embodiments will be described in detail referring to the accompanying drawings. Basically in all the drawings that illustrate the preferred embodiments, elements with like functions are designated by like reference numerals and repeated descriptions thereof are omitted.

First Embodiment

Figure 2:
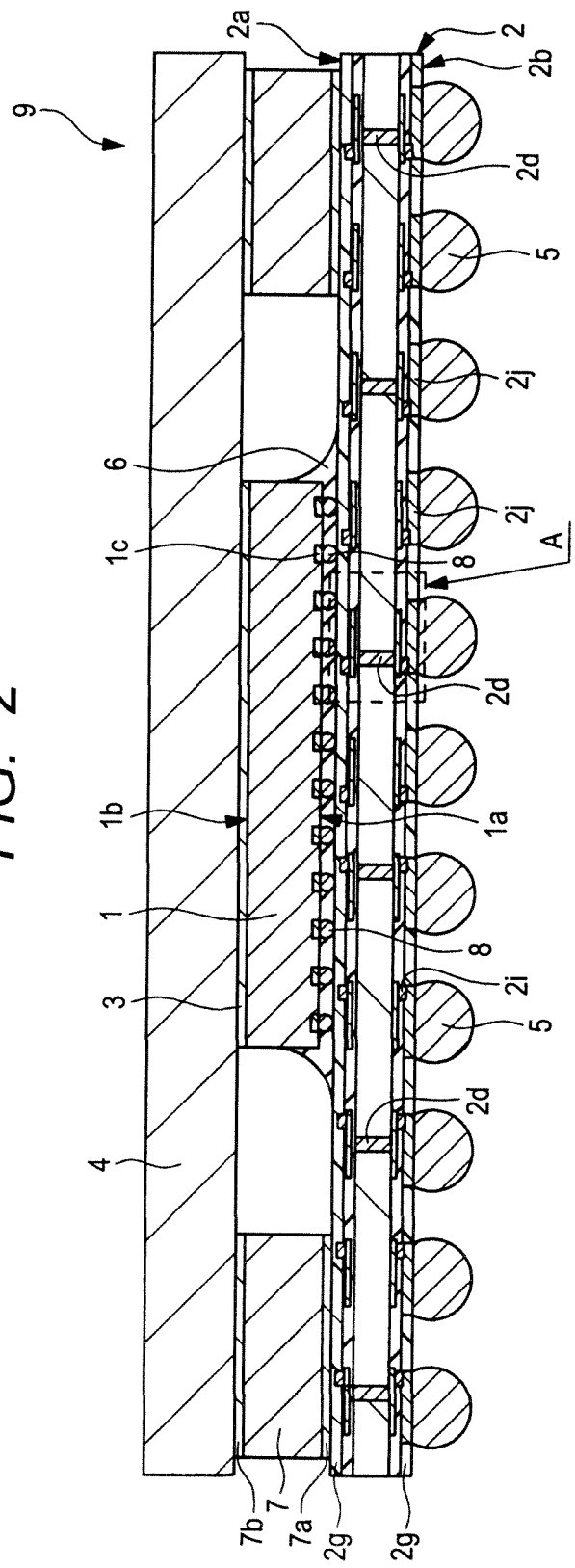
FIG. 2 is a sectional view of the semiconductor device shown in FIG. 1.
Figure 3:
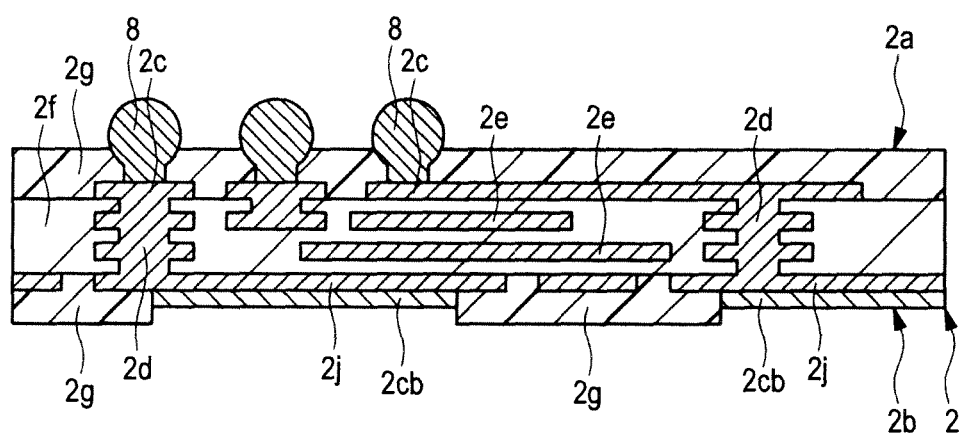
FIG. 3 is a fragmentary enlarged sectional view of part A of FIG. 2.
Figure 4:
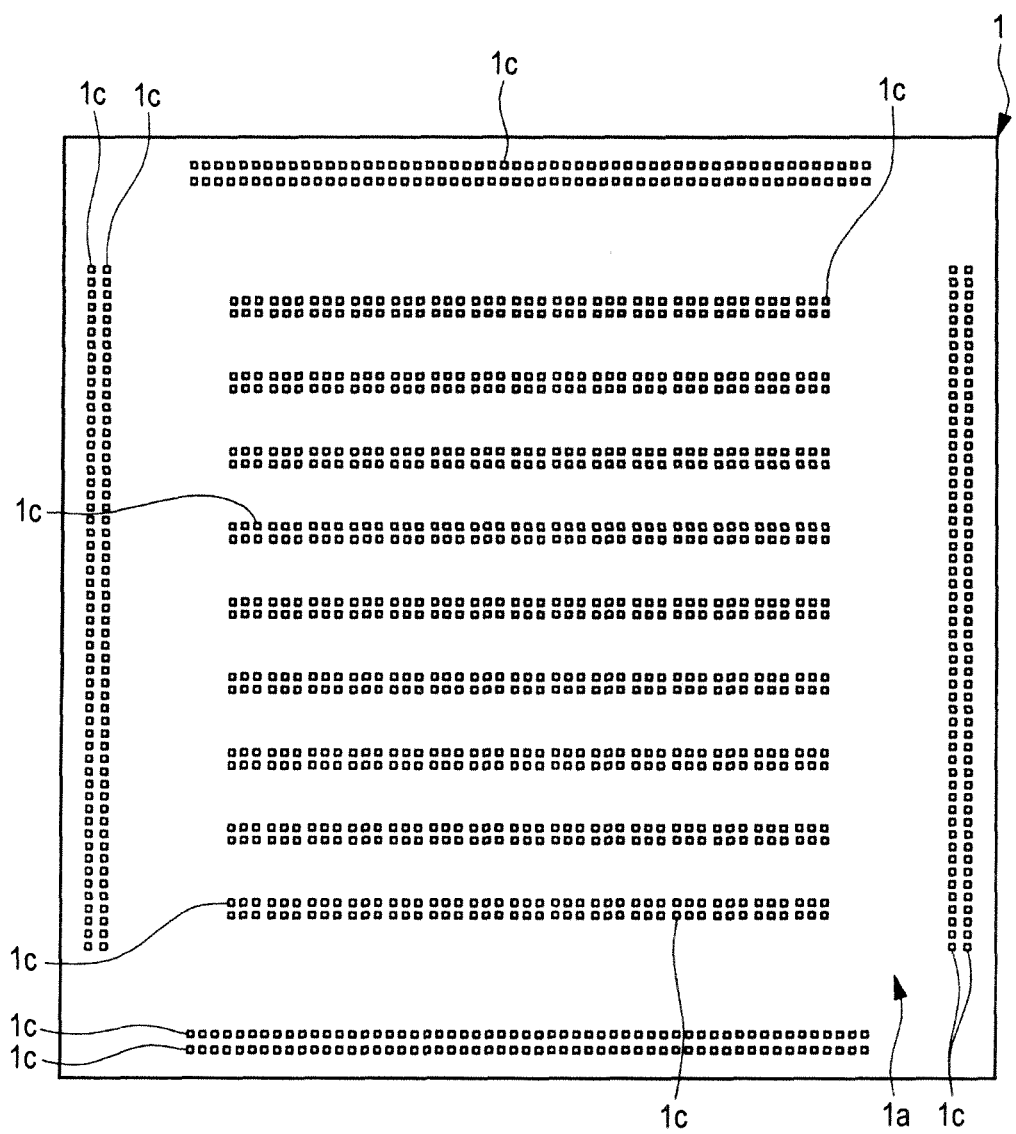
FIG. 4 is a plan view of an example of the electrode pad arrangement of the semiconductor chip mounted in the semiconductor device shown in FIG. 1.
Figure 5:
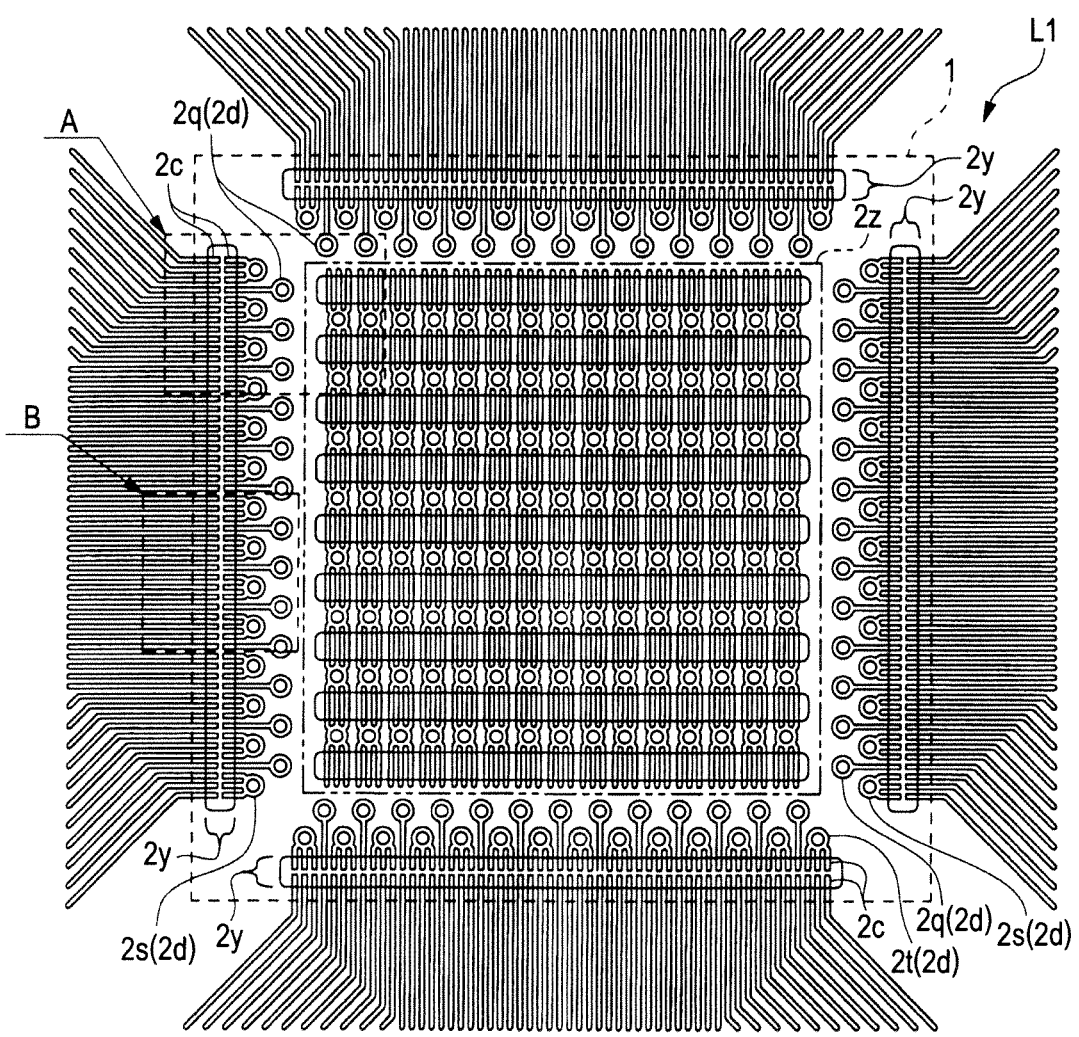
FIG. 5 is a plan view of an example of the wiring pattern of the area under the chip and its vicinity in the first wiring layer (L1) of the wiring substrate built in the semiconductor device shown in FIG. 1.
Figure 6:
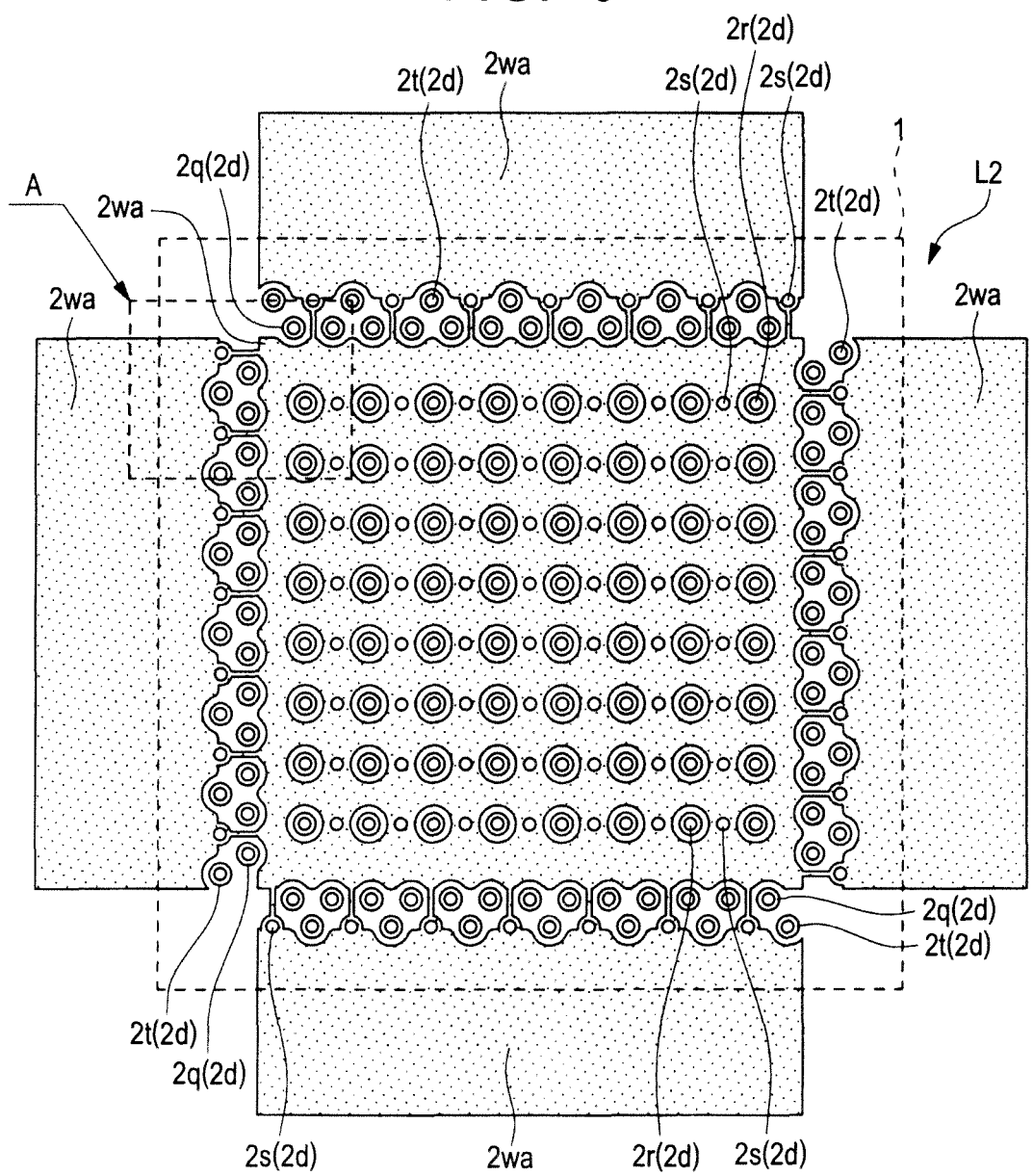
FIG. 6 is a plan view of an example of the wiring pattern of the area under the chip and its vicinity in the second wiring layer (L2) of the wiring substrate built in the semiconductor device shown in FIG. 1.
Figure 7:
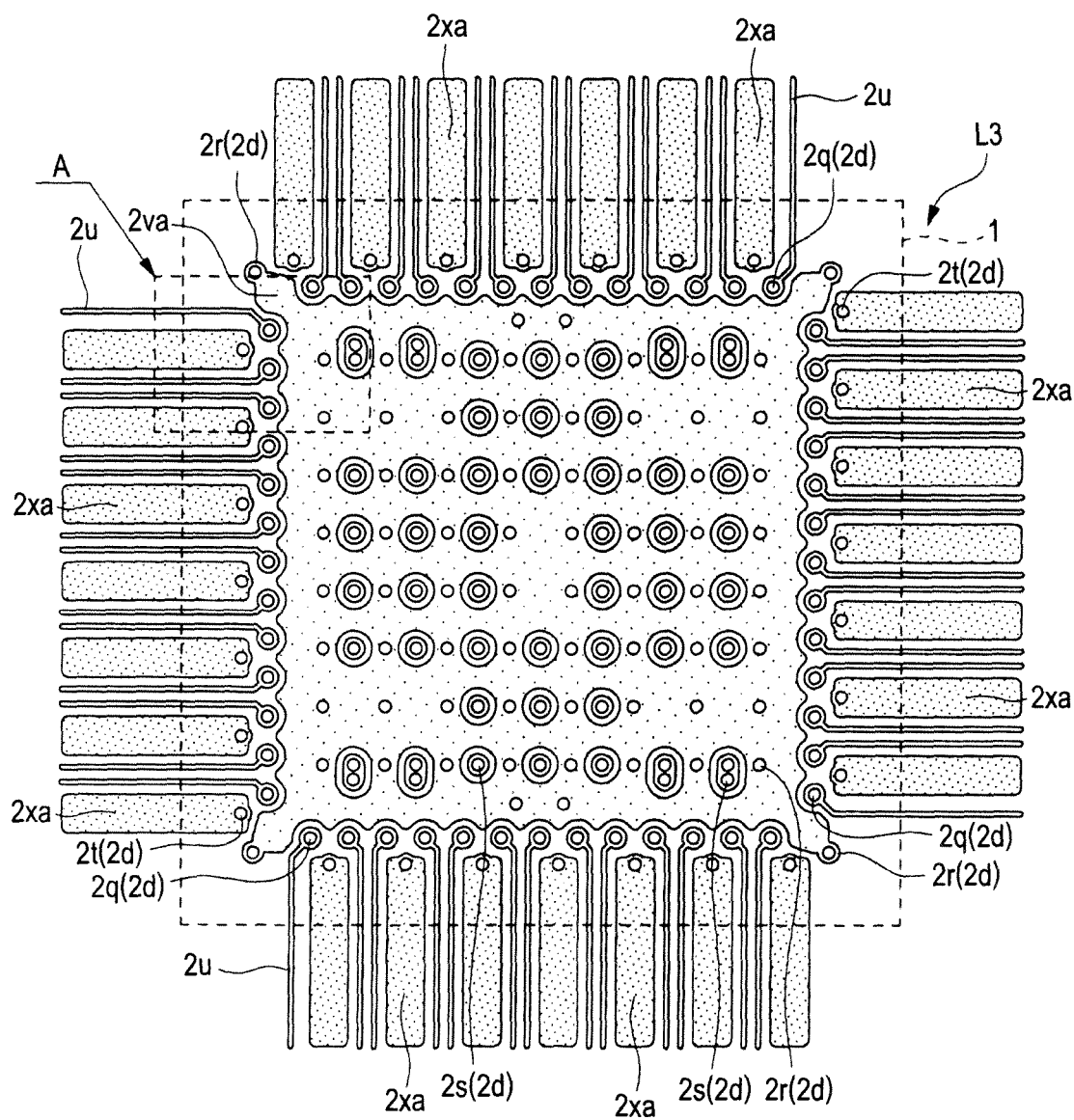
FIG. 7 is a plan view of an example of the wiring pattern of the area under the chip and its vicinity in the third wiring layer (L3) of the wiring substrate built in the semiconductor device shown in FIG. 1.
Figure 8:
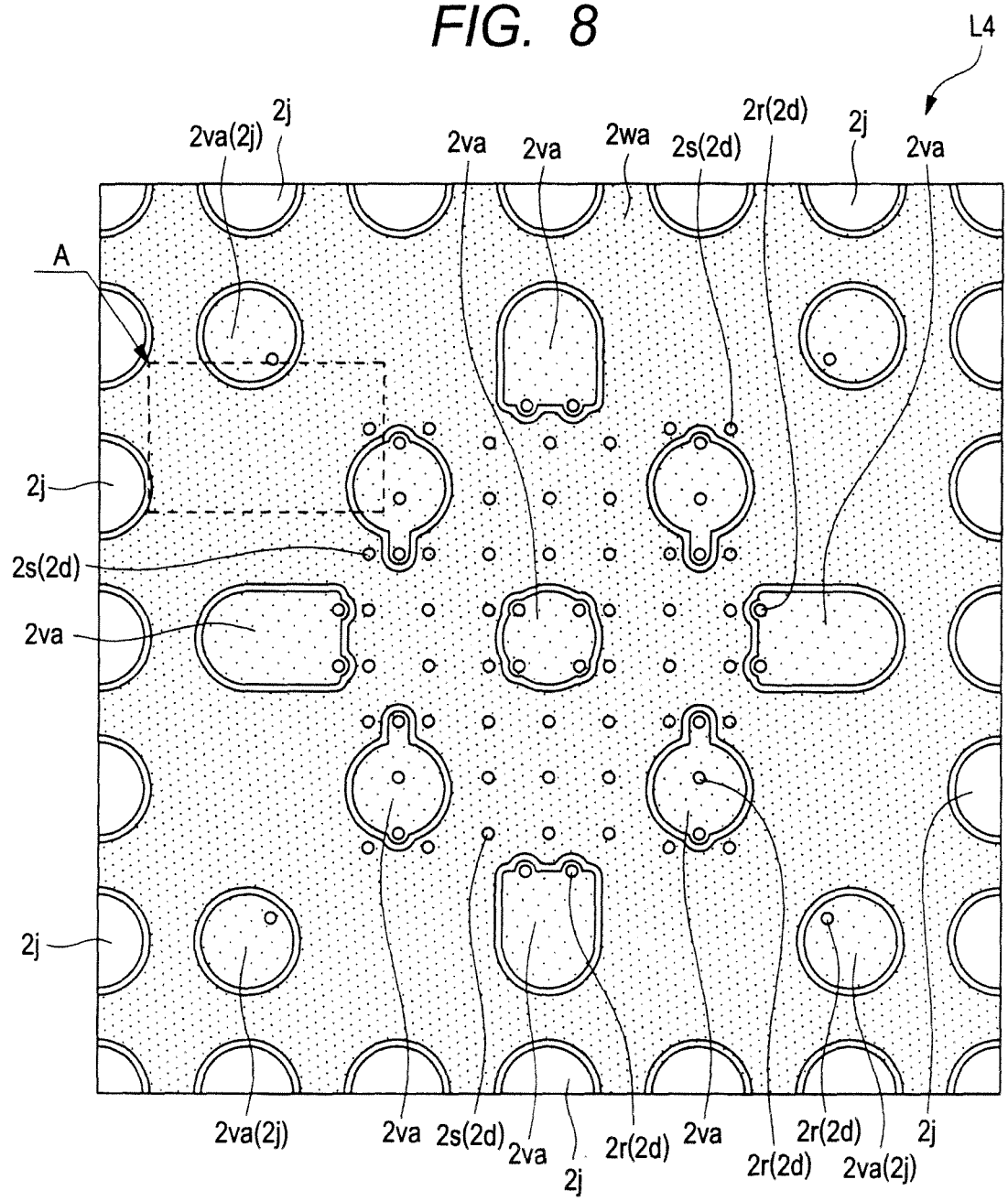
FIG. 8 is a plan view of an example of the wiring pattern of the area under the chip and its vicinity in the fourth wiring layer (L4) of the wiring substrate built in the semiconductor device shown in FIG. 1.
Figure 9:
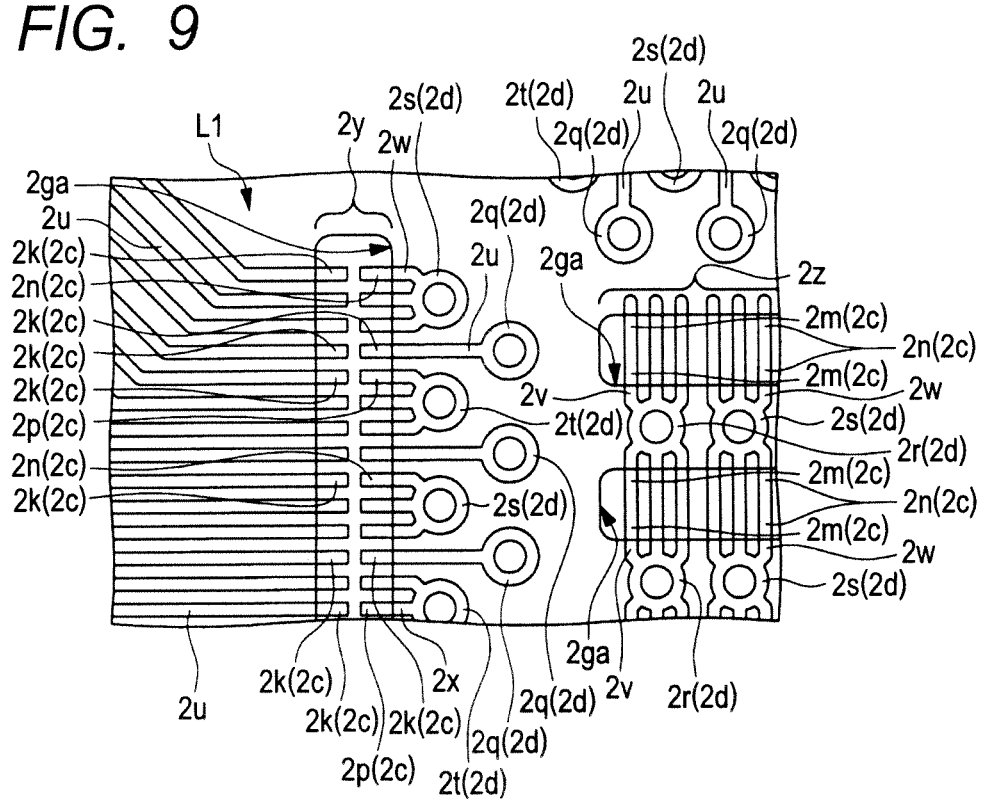
FIG. 9 is a fragmentary enlarged plan view of part A of FIG. 5.
Figure 10:
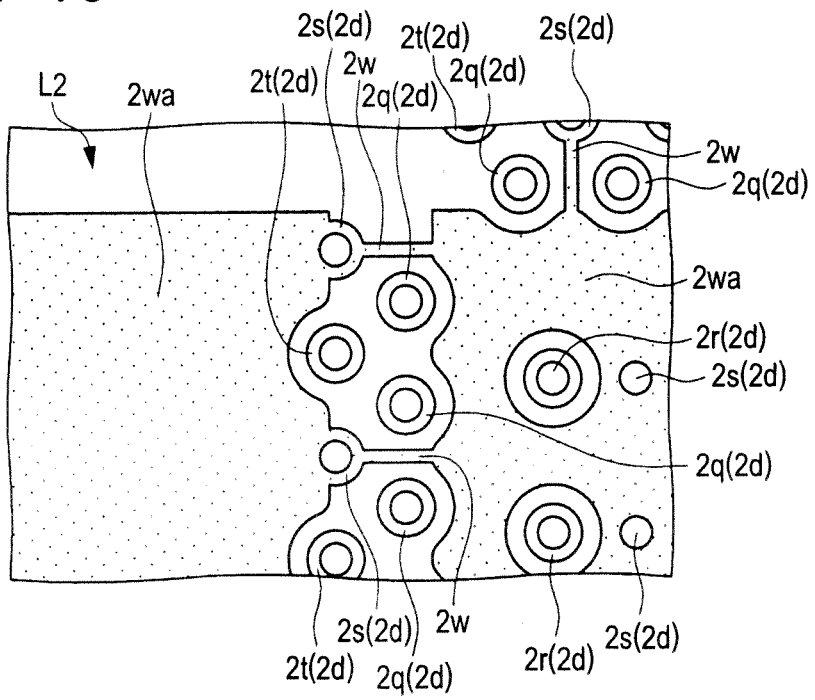
FIG. 10 is a fragmentary enlarged plan view of part A of FIG. 6.
Figure 11:
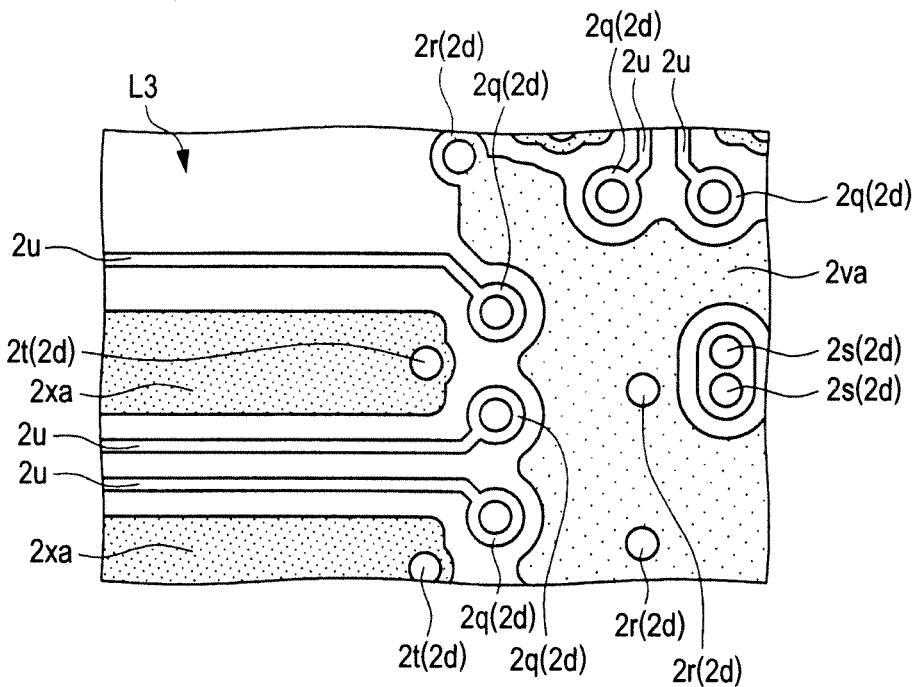
FIG. 11 is a fragmentary enlarged plan view of part A of FIG. 7.
Figure 12:
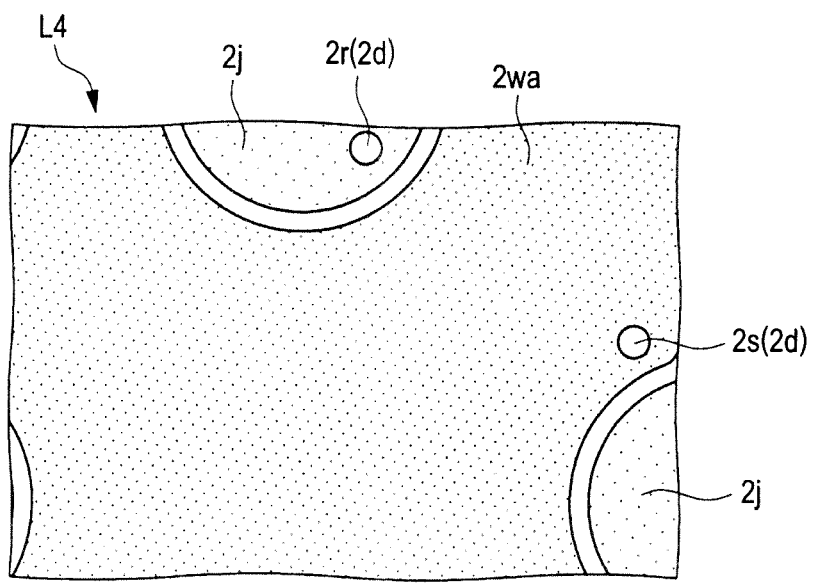
FIG. 12 is a fragmentary enlarged plan view of part A of FIG. 8.
Figure 13:
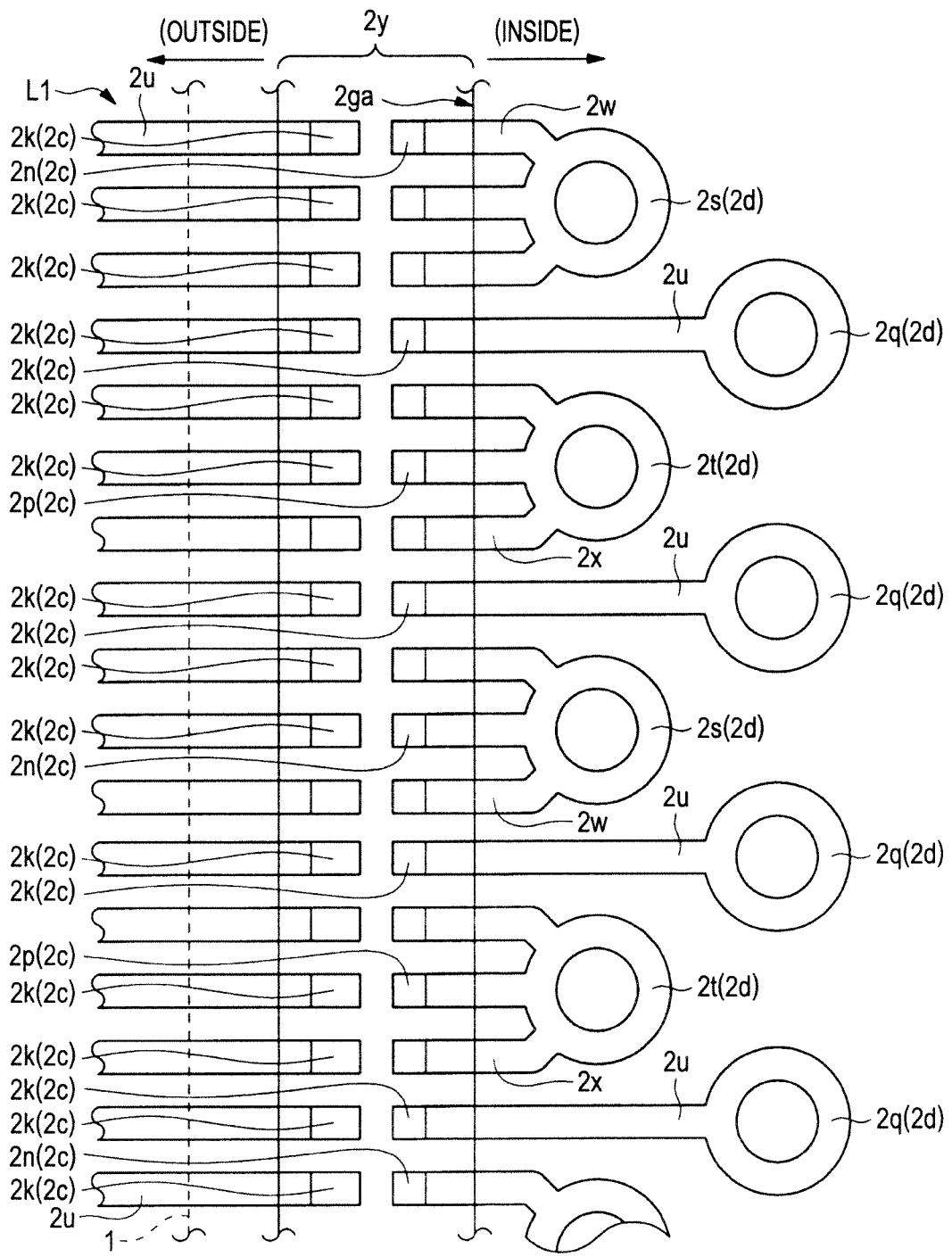
FIG. 13 is a fragmentary enlarged plan view of part B of FIG. 5.
Figure 15:
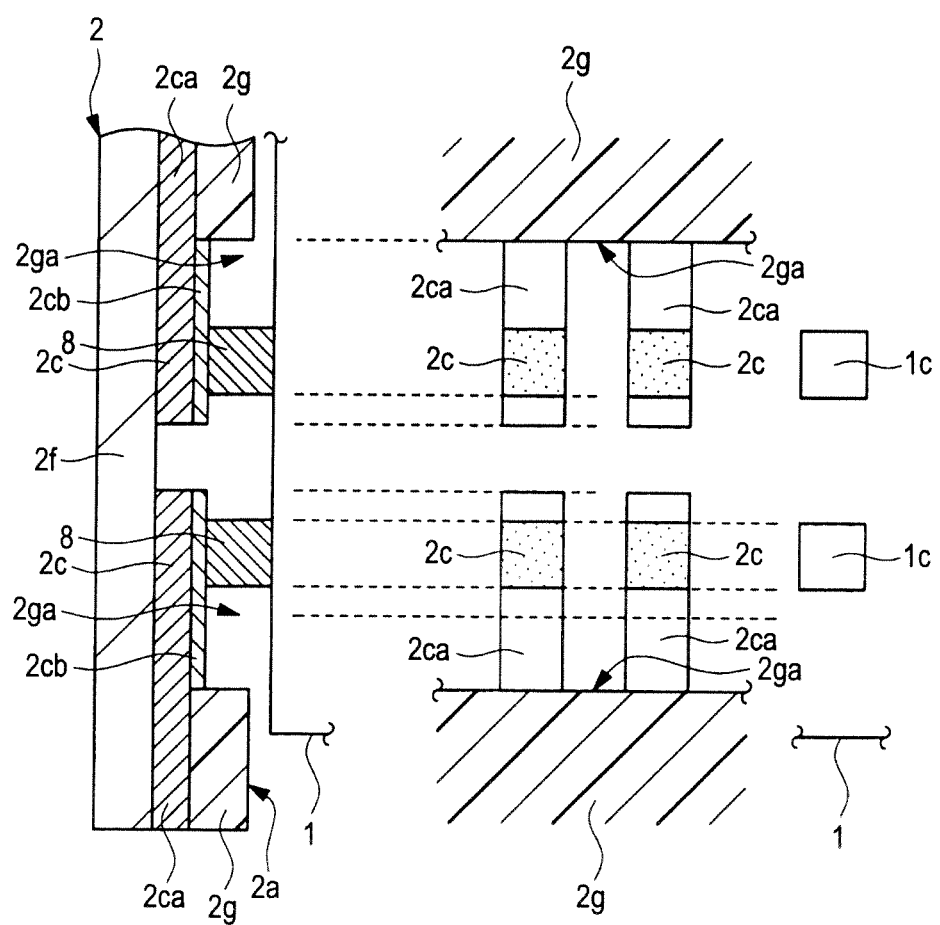
FIG. 15 is a fragmentary enlarged sectional view combined with a fragmentary enlarged plan view, showing the positional relation between the bonding electrodes and bumps of the wiring substrate for peripheral pads and the electrode pads of the semiconductor chip in the semiconductor device according to the first embodiment.
Figure 16:
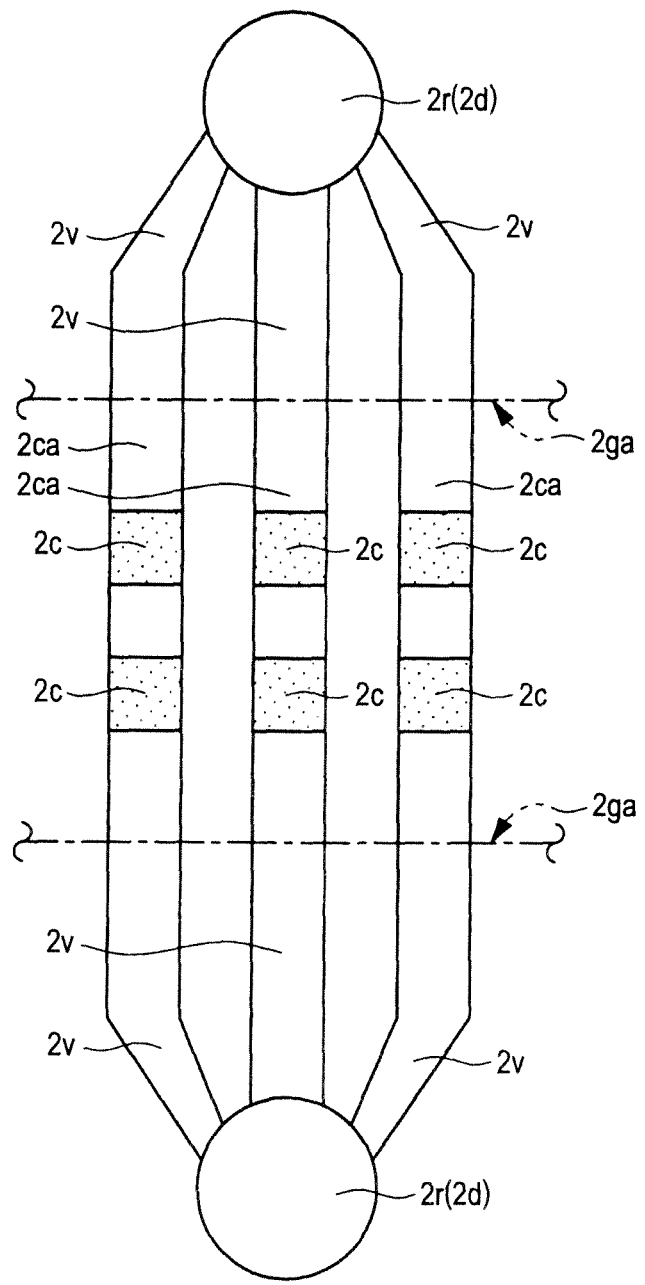
FIG. 16 is a fragmentary enlarged plan view showing the shape of bonding electrodes of the wiring substrate for central pads in the semiconductor device according to the first embodiment.
Figure 17:
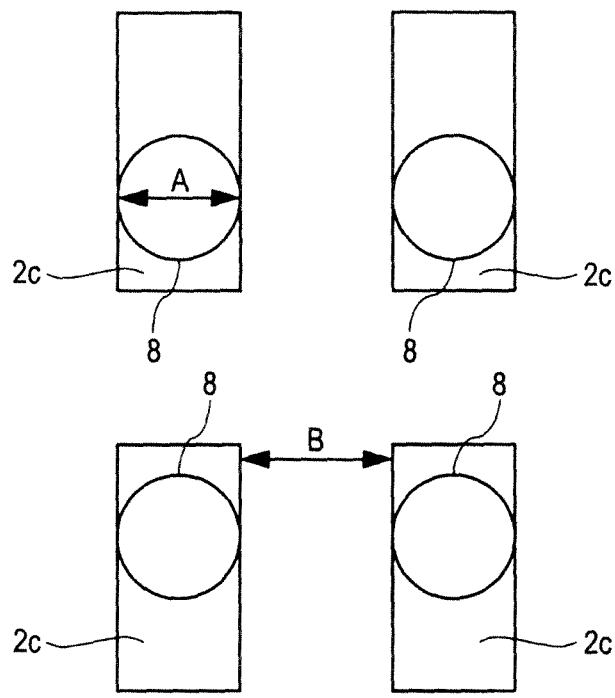
FIG. 17 is a plan view showing an example of the relation between the bump size and the bonding electrode size of the substrate at a flip-chip joint in the semiconductor device according to the first embodiment.
Figure 18:
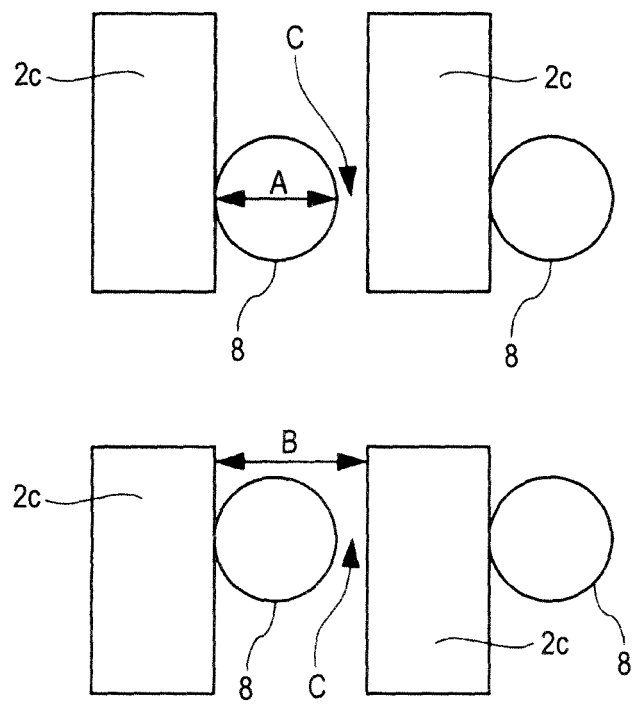
FIG. 18 is a plan view showing an example of the relation between the bump size and the bonding electrode size of the substrate at a flip-chip joint in the semiconductor device according to the first embodiment.

FIG. 1 is a partially broken perspective view of the structure of a semiconductor device according to a first embodiment of the invention; FIG. 2 is a sectional view of the semiconductor device shown in FIG. 1; FIG. 3 is a fragmentary enlarged sectional view of part A of FIG. 2; and FIG. 4 is a plan view of an example of the electrode pad arrangement of the semiconductor chip mounted in the semiconductor device shown in FIG. 1. FIG. 5 is a plan view of an example of the wiring pattern of the area under the chip and its vicinity in the first wiring layer (L1) of the wiring substrate built in the semiconductor device shown in FIG. 1; FIG. 6 is a plan view of an example of the wiring pattern of the area under the chip and its vicinity in the second wiring layer (L2) of the wiring substrate built in the semiconductor device shown in FIG. 1; FIG. 7 is a plan view of an example of the wiring pattern of the area under the chip and its vicinity in the third wiring layer (L3) of the wiring substrate built in the semiconductor device shown in FIG. 1; and FIG. 8 is a plan view of an example of the wiring pattern of the area under the chip and its vicinity in the fourth wiring layer (L4) of the wiring substrate built in the semiconductor device shown in FIG. 1. FIG. 9 is a fragmentary enlarged plan view of part A of FIG. 5; FIG. 10 is a fragmentary enlarged plan view of part A of FIG. 6; FIG. 11 is a fragmentary enlarged plan view of part A of FIG. 7; FIG. 12 is a fragmentary enlarged plan view of part A of FIG. 8; and FIG. 13 is a fragmentary enlarged plan view of part B of FIG. 5. FIG. 14 shows data on the relation between pad arrangement type and substrate structure type in the semiconductor chip mounted in the semiconductor device shown in FIG. 1; FIG. 15 is a fragmentary enlarged sectional view combined with a fragmentary enlarged plan view, showing the positional relation between the bonding electrodes and bumps of the wiring substrate for peripheral pads and the electrode pads of the semiconductor chip in the semiconductor device according to the first embodiment; FIG. 16 is a fragmentary enlarged plan view showing the shape of bonding electrodes of the wiring substrate for central pads in the semiconductor device according to the first embodiment; FIG. 17 is a plan view showing an example of the relation between the bump size and the bonding electrode size of the substrate at a flip-chip joint in the semiconductor device according to the first embodiment; and FIG. 18 is a plan view showing an example of the relation between the bump size and the bonding electrode size of the substrate at a flip-chip joint in the semiconductor device according to the first embodiment.

The semiconductor device according to the first embodiment as shown in FIGS. 1 and 2 is a semiconductor package in which a semiconductor chip 1 is flip-chip mounted over the upper surface 2a of an wiring substrate by soldering. In this first embodiment, it is a BGA 9 in which a plurality of solder balls 5 as external terminals are arranged in a grid pattern on the lower surface 2b of the wiring substrate. In other words, the semiconductor device according to the first embodiment is a flip-chip BGA 9; for example, it may be a multi-pin semiconductor package with not less than hundreds of pins as external terminals.

Details of the BGA 9 are explained below. The BGA 9 includes: a multilayer wiring substrate 2 having an upper surface 2a and a lower surface 2b opposite to the upper surface 2a; a semiconductor chip 1 which has a main surface 1a and a back surface 1b opposite to the main surface 1a and is flip-chip mounted over the upper surface 2a of the multilayer wiring substrate 2; and an array of solder balls 5 as external terminals disposed on the lower surface 2b of the multilayer wiring substrate 2.

Here, the semiconductor chip 1, having a plurality of electrode pads 1c as surface electrodes formed on its main surface 1a, is flip-chip (face-down) mounted over the upper surface 2a of the multilayer wiring substrate 2. In other words, the semiconductor chip 1 is mounted over the multilayer wiring substrate 2 with its main surface 1a facing the upper surface 2a of the multilayer wiring substrate 2. Here, the semiconductor chip 1 is electrically coupled to the multilayer wiring substrate 2 by soldering, in which they are flip-chip coupled through a plurality of solder bumps 8.

Also, as shown in FIG. 5, on the upper surface 2a of the multilayer wiring substrate 2 (BGA substrate), a plurality of bonding electrodes 2c lie in a region where the semiconductor chip 1 is to be flip-chip mounted. More specifically, the electrode pads 1c of the semiconductor chip 1 and the bonding electrodes 2c for flip-chip coupling through the solder bumps 8 are located in the chip mounting area of the upper surface 2a of the multilayer wiring substrate 2.

A plurality of bonding electrodes 2c are arranged in two rows in first regions 2y of the chip mounting area of the upper surface 2a of the multilayer wiring substrate 2 which are opposite to the peripheral areas of the main surface 1a of the semiconductor chip 1. Also, an array of power supply and GND bonding electrodes (bonding electrodes 2m for core power supply and bonding electrodes 2n for GND) are formed in a second region 2z inside the first regions 2y. Here, power supply and GND refer to operating electric potentials supplied to the integrated circuit of the semiconductor chip 1, in which power supply potential is, for example, 3.0 V for an external power supply and 1.5 V for an internal power supply (core power supply) and GND potential is 0 V (grounding potential).

More specifically, an array of power supply and GND bonding electrodes are arranged in the second region 2z near the center of the chip mounting area of the upper surface 2a of the multilayer wiring substrate 2. The first regions 2y are located around the second region 2z, in which a plurality of bonding electrodes 2c are arranged in two rows in each of the first regions 2y.

On the other hand, as shown in FIG. 2, an array of lands 2j are arranged on the lower surface 2b of the multilayer wiring substrate 2, with a solder ball 5 as an external terminal coupled to each land 2j.

The flip chip joints, lying between the multilayer wiring substrate 2 and the semiconductor chip 1, and their surroundings are filled with underfill resin 6 to solidify the flip chip joints for protection.

Furthermore, a stiffener ring 7 is attached to the periphery of the upper surface 2a of the multilayer wiring substrate 2 in a way to surround the semiconductor chip 1. The stiffener ring 7 is bonded to the multilayer wiring substrate 2 with a ring-shaped tape 7a. A heat spreader 4 is provided over the stiffener ring 7. The heat spreader 4 is joined to the stiffener ring 7 and the back surface 1b of the semiconductor chip 1 through heat-radiating resin 3 on the semiconductor chip 1 and an adhesive agent (for example, tape material) 7b between the stiffener ring 7 and heat spreader 4.

Consequently, heat generated from the semiconductor chip is transferred to the heat spreader 4 through the heat-radiating resin 3 and dissipated out from the heat spreader 4 and meanwhile the heat is also transferred to the multilayer wiring substrate 2 through the solder bumps 8, then from the solder balls 5 to the mounting substrate. Also the heat is transferred from the heat spreader 4 through the adhesive agent 7b and stiffener ring 7 to the multilayer wiring substrate 2, from which it is transferred through the solder balls 5 to the mounting substrate and finally dissipated.

As shown in FIG. 3, the multilayer wiring substrate 2 of the BGA 9 according to the first embodiment is a coreless substrate without a core layer 2h (FIG. 19) as a base layer, in which it includes a buildup layer 2f, a plurality of bonding electrodes 2c formed on the front surface of the buildup layer 2f (upper surface 2a of the multilayer wiring substrate 2), a plurality of lands 2j formed on the back surface of the buildup layer 2f (lower surface 2b of the multilayer wiring substrate 2), through holes (wirings) 2d for electrically coupling the bonding electrodes 2c on the front surface to the lands 2j on the back surface, internal wirings 2e in the buildup layer 2f and so on.

Solder resist film 2g as insulator lies around the bonding electrodes 2c and around the lands 2j.

The bonding electrodes 2c on the upper surface 2a and the corresponding lands 2j on the lower surface 2b are electrically coupled through the through holes (wirings) 2d, via hole wirings 2i (FIG. 2) or internal wiring 2e in the buildup layer 2f.

As shown in FIG. 4, the semiconductor chip 1 is, for example, made of silicon with the electrode pads 1c as surface electrodes formed on its main surface 1a. In the peripheral areas of the main surface 1a, two rows of electrode pads 1c are located along each side and arrays of electrode pads 1c are arranged inside the rows of electrode pads in the peripheral areas.

As shown in FIG. 2, the underfill resin 6 coated between the chip and substrate is, for example, epoxy resin. The stiffener ring 7 and heat spreader 4 are made of metal with a high thermal conductivity and the solder bumps 8 for flip-chip coupling and the solder balls 5 as external terminals are, for example, made of a lead-free solder material.

The bonding electrodes 2c, via hole wirings 2i, internal wiring 2e, and through holes 2d of the multilayer wiring substrate 2 are, for example, made of pure copper or copper alloy containing a low percentage (1% or less) of impurity such as aluminum or silicon (Si).

Figure 19:
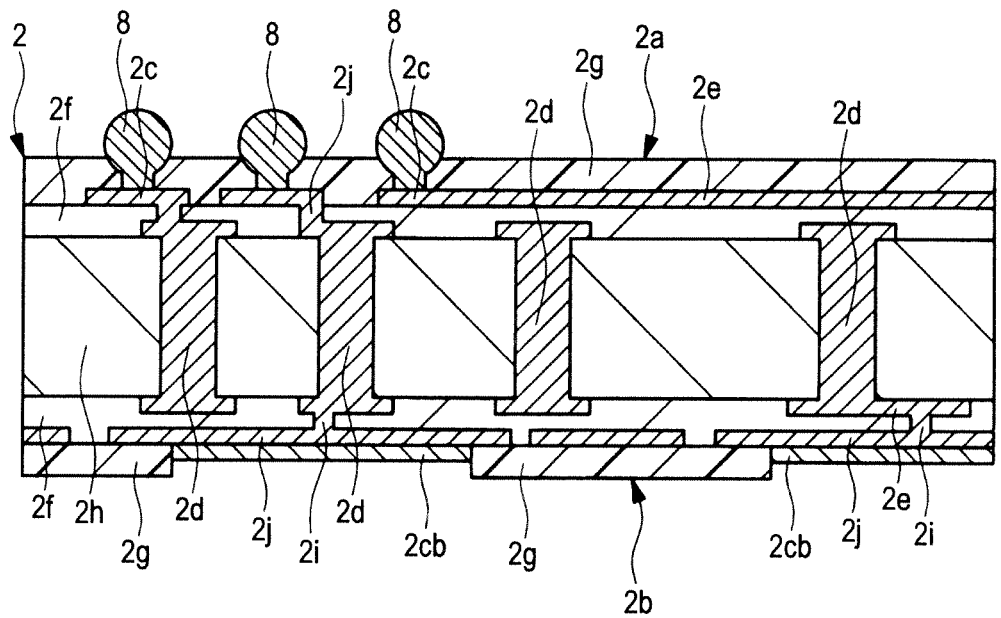
FIG. 19 is a fragmentary enlarged sectional view of the wiring substrate built in the semiconductor device according to a first variation of the first embodiment.

The multilayer wiring substrate 2 of the BGA 9 according to the first embodiment is a thin coreless substrate without a core layer 2h (FIG. 19). Due to the absence of a core layer, through holes 2d can be made by laser or photolithographic processing and as a consequence, the through hole pitch (interval between through holes) can be decreased and the bump pitch (interval between bumps) can also be decreased. The thickness of the coreless substrate should be 0.2 mm or less; in the first embodiment, it is, for example, between 0.03 mm and 0.05 mm.

FIG. 14 shows the relation between pad arrangement type and substrate structure type as found by an investigation by the present inventors, based on which the structure of the multilayer wiring substrate 2 of the BGA 9 according to the first embodiment is determined. The present invention is intended to provide a multi-pin structure at lower cost; for a multi-pin structure, the through hole pitch and bump pitch must be decreased and for cost reduction, the number of wiring layers of the multilayer wiring substrate 2 must be decreased as far as possible.

If it is possible to make many wiring layers, it would be easy to decrease the through hole pitch or bump pitch; however, this approach cannot be adopted because it is costly.

As shown in FIG. 14, it has been found that the number of wiring layers can be decreased to create a multi-pin structure by changing the signal pad pitch from 64 μm to 20 μm (in the direction of arrow B in FIG. 14), so it is necessary to find what conditions are required to realize a signal pad pitch of 20 μm or so.

As shown in FIG. 14, when the number of signal pad rows is increased from 4 to 12 (in the direction of arrow A in FIG. 14) in the case of area arrangement, the signal pad pitch can be decreased from 64 μm to 21 μm but six wiring layers are required for the coreless substrate (multilayer wiring substrate 2).

So, if peripheral arrangement type and two rows are selected for the signal pad arrangement instead, the signal pad pitch is 20 μm (C in FIG. 14) and in this case, if the coreless substrate is used, only four wiring layers are required (D in FIG. 14). By doing so, the cost of the multilayer wiring substrate 2 can be reduced. On the other hand, if peripheral arrangement type and two rows are selected for the signal pad arrangement, it is possible to adopt a cored substrate with eight wiring layers; however, in that case, since the substrate has eight wiring layers, cost reduction cannot be achieved.

Therefore, by selecting peripheral arrangement type with two rows of signal pads and using a coreless substrate with four wiring layers for the BGA 9 according to the first embodiment, the multilayer wiring substrate 2 can be thin and cost reduction can be achieved. In other words, due to the use of a coreless substrate, the multilayer wiring substrate 2 can be thin, the through hole pitch can be as small as 150-200 μm and the bump pitch can be as small as 100-150 μm.

Consequently it is possible to provide a multi-pin structure with a signal pad pitch of 20 μm or so and also since it uses only four wiring layers, the cost of the multilayer wiring substrate 2 can be reduced.

Next, the wiring pattern of each of the four wiring layers of the multilayer wiring substrate 2 according to the first embodiment will be described referring to FIGS. 5 to 13.

FIG. 5 shows the wiring pattern of the uppermost wiring layer, or a first wiring layer L1, nearest to the upper surface 2a of the multilayer wiring substrate 2 shown in FIG. 2, in which this wiring layer faces the main surface 1a of the semiconductor chip 1 where flip-chip coupling is made. In the first wiring layer L1, a plurality of bonding electrodes 2c are arranged in two rows in the first regions 2y of the chip mounting area of the upper surface 2a of the multilayer wiring substrate 2 which are opposite to the peripheral areas of the main surface 1a of the semiconductor chip 1. Also, an array of power supply and GND bonding electrodes (bonding electrodes 2m for core power supply and bonding electrodes 2n for GND as shown in FIG. 9) are formed in the second region 2z inside the first regions 2y.

More specifically, an array of core power supply bonding electrode and GND bonding electrodes 2n as shown in FIG. 9 are arranged in the second region 2z near the center of the chip mounting area and in the first regions 2y around the second region 2z, a plurality of bonding electrodes 2c are arranged in two rows.

As shown in FIGS. 9 and 13, the bonding electrodes 2c in each first region 2y include a plurality of bonding electrodes 2k for signals and the bonding electrodes 2k for signals are separated into inner and outer ones. A plurality of signal wirings 2u drawn inside from the signal bonding electrodes 2k are each electrically coupled to wiring portions 2ca (FIG. 15) in another layer through the through holes 2d and as shown in FIG. 5, the through holes 2d are located between each first region 2y and the second region 2z.

As shown in FIG. 13, looking at the signal bonding electrodes 2k among the bonding electrodes 2c in each first region 2y, so far as the two (inner and outer) rows of bonding electrodes 2c are concerned, the signal wirings 2u electrically coupled to the outer row of signal bonding electrodes 2k are drawn outside while the signal wirings 2u electrically coupled to the inner row of signal bonding electrodes 2k are drawn inside.

In other words, the lead wirings for the bonding electrodes 2c in the outer row are drawn outside while the lead wirings for the bonding electrodes 2c in the inner row are drawn inside. Therefore, as shown in FIG. 9, the signal wirings 2u drawn inside from the signal bonding electrodes 2k in the inner row are each electrically coupled to signal through holes 2q and these signal through holes 2q are located between each first region 2y and the second region 2z. In this first embodiment, among the bonding electrodes 2c arranged in two rows in each first region 2y, those in the outer row are all signal bonding electrodes 2k.

As shown in FIG. 13, the bonding electrodes 2c in each first region 2y include a plurality of GND bonding electrodes 2n and a plurality of IO power supply bonding electrodes 2p as well as the signal bonding electrodes 2k. These GND bonding electrodes 2n and IO power supply bonding electrodes 2p all lie in the inner row in the first region 2y.

Also, in a region on the inside of the first region 2y there are provided a plurality of GND through holes 2s electrically coupled to the GND bonding electrodes 2n through GND wirings 2w and a plurality of IO power supply through holes 2t electrically coupled to the IO power supply bonding electrodes 2p through IO power supply wirings 2x. In other words, the GND through holes 2s and IO power supply through holes 2t are located between each first region 2y and the second region 2z.

Therefore, as shown in FIG. 5, the signal through holes 2q, GND through holes 2s, and IO power supply through holes 2t are located between the first regions 2y and the second region 2z.

On the other hand, as shown in FIGS. 5 and 9, a plurality of power supply and GND bonding electrodes lie in the second region 2z. The power supply bonding electrodes are bonding electrodes 2m for core power supply. Specifically, an array of core power supply bonding electrodes 2m and GND bonding electrodes 2n lie in the second region 2z, in which each core power supply bonding electrode 2m has a core power supply through hole 2r through a core power supply wiring 2v and each GND bonding electrode 2n has a GND through hole 2s through a GND wiring 2w.

In other words, an array of core power supply through holes 2r and GND through holes 2s are located in the second region 2z.

The through holes 2d between the first regions 2y and the second region 2z (signal through holes 2q, GND through holes 2s, IO power supply through holes 2t) and the through holes 2d in the second region 2z (core power supply through holes 2r, GND through holes 2s) are both spaced at a very small pitch of 150-200 μm.

FIG. 6 shows the wiring pattern of a second wiring layer L2 just under the first wiring layer L1 of the multilayer wiring substrate 2. In other words, it shows the wiring pattern of the second wiring layer from the upper surface 2a (wiring layer next to the upper surface 2a) in the direction from the upper surface 2a of the multilayer wiring substrate 2 to the lower surface 2b.

As shown in FIG. 6, a large GND plane 2wa is formed in the second wiring layer L2. The GND plane 2wa is electrically coupled to the GND bonding electrodes 2n in the first layer L1 through the GND wirings 2w and GND through holes 2s.

Furthermore, as shown in FIG. 10, in the second wiring layer L2, a plurality of signal through holes 2q, IO power supply through holes 2t, and core power supply through holes 2r are disposed and isolated from the GND plane 2wa.

The reason that the GND plane 2wa is provided in the second wiring layer L2 is that the plane, located near the signal wirings 2u in the first wiring layer L1, makes them less susceptible to noise and contributes to stabilization of signals.

More specifically, the signal wirings 2u in the first wiring layer L1 are less susceptible to noise and ensure stable signals because the GND wirings 2w and IP power supply wirings 2x in the first wiring layer L1 are adjacent to them as shown in FIG. 13 and also the GND plane 2wa as shown in FIG. 10 lies just under them, namely they are surrounded by power supply and GND members.

Next, FIG. 7 shows the wiring pattern of a third wiring layer L3 just under the second wiring layer L2 of the multilayer wiring substrate 2. In other words, it shows the wiring pattern of the third wiring layer from the upper surface 2a (wiring layer next to the second wiring layer L2) in the direction from the upper surface 2a of the multilayer wiring substrate 2 to the lower surface 2b.

As shown in FIGS. 7 and 11, a core power supply plane 2va lies almost in the center of the third wiring layer L3 and a plurality of oblong IO power supply planes 2xa are formed around the plane 2va. In other words, the core power supply plane 2va and IO power supply planes 2xa are located in the third wiring layer next to (under) the second wiring layer L2 with the GND plane 2wa formed thereon, in the direction from the upper surface 2a of the multilayer wiring substrate 2 to the lower surface 2b.

Here, the core power supply plane 2va is electrically coupled to the core power supply bonding electrodes 2m in the second region 2z of the first wiring layer L1 through the core power supply wirings 2v and core power supply through holes 2r. On the other hand, the IO power supply planes 2xa are electrically coupled to the IO power supply bonding electrodes 2p in the first regions 2y of the first wiring layer L1 through the IO power supply wirings 2x and IO power supply through holes 2t.

As described above, in the multilayer wiring substrate 2, the GND plane 2wa electrically coupled to the GND bonding electrodes 2n in the second region 2z in the center of the first wiring layer L1 lies in the second wiring layer L2 and similarly the core power supply plane 2va electrically coupled to the core power supply bonding electrodes 2m in the second region 2z of the first wiring layer L1 lies in the third wiring layer L3. In other words, the GND electrodes and power supply electrodes in the first wiring layer L1 are coupled to different wiring layers, namely the second wiring layer L2 and third wiring layer L3 respectively.

This arrangement is possible because the diameter of each through hole 2d and the through hole pitch are small; more specifically it is possible because through holes 2d can be densely made in the second region 2z of the first wiring layer L1 by laser processing.

Also a plurality of signal wirings 2u are provided in the third wiring layer L3. The signal wirings 2u in the third wiring layer L3 are electrically coupled to the signal bonding electrodes 2k in the first regions 2y of the first wiring layer L1 through the signal wirings 2u and signal through holes 2q in the first wiring layer L1. More specifically, the signal wirings 2u drawn inside, among those of the signal bonding electrodes 2k in the first regions 2y of the first wiring layer L1, are electrically coupled to the signal wirings 2u in the third wiring layer L3 through the signal through holes 2q located between the first regions 2y and second region 2z, and the signal wirings 2u in the third wiring layer L3 are each drawn outside through the signal through holes 2q.

In other words, among the wirings for the signal bonding electrodes 2k in the first regions 2y of the first wiring layer L1, the signal wirings 2u in the third wiring layer L3 (another layer) electrically coupled to the signal wirings 2u drawn inside through the signal through holes 2q are drawn outside in the third wiring layer L3. Therefore, the signal through holes 2q are all located outside the second region 2z in the first wiring layer L1.

In the third wiring layer L3, the signal wirings 2u are arranged in pairs and oblong IO power supply planes 2xa are located on both sides of each pair of signal wirings 2u.

The BGA 9 according to the first embodiment is a multi-pin semiconductor device with not less than hundreds of pins. In this semiconductor device, in order to arrange, in a small number of wiring layers, signal wirings 2u to be connected to a desired number of signal pins, signal through holes 2q are also provided inside the first regions 2y (between the first regions 2y and second region 2z) so as to permit the signal wirings 2u to be drawn outside in another wiring layer (in this case, the third wiring layer L3), because the number of signal wirings 2u arranged only outside the first regions 2y in the first wiring layer L1 is insufficient. This device structure permits not less than hundreds of pins to be arranged in a small number of wiring layers.

For this purpose, the device uses a thin substrate such as a coreless substrate so that the diameter of through holes 2d in the second region 2z under the chip and the through hole pitch can be small enough to obtain space for the formation of signal through holes 2q between the first regions 2y and second region 2z of the first wiring layer L1. The presence of signal through holes 2q between the first regions 2y and second region 2z makes it possible to realize a semiconductor device in which not less than hundreds of pins are arranged in a small number of wiring layers as mentioned above.

Next, FIG. 8 shows the wiring pattern of a fourth wiring layer L4 just under the third wiring layer L3 of the multilayer wiring substrate 2. In other words, it shows the wiring pattern of the fourth wiring layer from the upper surface 2a (wiring layer next to the third wiring layer L3) in the direction from the upper surface 2a of the multilayer wiring substrate 2 to the lower surface 2b.

As shown in FIGS. 8 and 12, in the fourth wiring layer L4, a GND plane 2wa electrically coupled to the GND planes 2wa in the second wiring layer L2 through the GND through holes 2s and a plurality of core power supply planes 2va electrically coupled to the core power supply planes 2va in the third wiring layer L3 through the core power supply through holes 2r are formed and lands 2j for GND, those for power supply, and those for signals which are electrically coupled to the relevant planes are provided. Each land 2j is coupled to a solder ball 5 which is an external terminal for the BGA 9.

The GND plane 2wa in the fourth wiring layer L4 is electrically coupled to the GND plane 2wa in the second wiring layer L2 only through the GND through holes 2s. This stabilizes the GND potential of the multilayer wiring substrate 2.

FIGS. 15 and 16 show wiring portions 2ca exposed in an opening 2ga of the solder resist film 2g and bonding electrodes 2c, in which FIG. 15 illustrates bonding electrodes 2c for peripheral pads in a first region 2y of the upper surface 2a and FIG. 16 illustrates bonding electrodes 2c for area arrangement in the second region 2z of the upper surface 2a. In flip-chip coupling of either type of bonding electrode 2c, a plating layer 2cb overlying the bonding electrode 2c is brought into contact with a solder bump 8. In the BGA 9 according to the first embodiment, solder bumps 8 are, for example, cylindrical to enable flip-chip coupling with a small signal pad pitch of 20 µm.

FIGS. 17 and 18 show an example of the relation between bump size on the chip and minimum spacing between wirings on the substrate. Regarding the relation between solder bump size A and spacing B between wirings (bonding electrodes 2C) as shown in FIG. 17, the relation of A<B (bump size<spacing) exists so that when a solder bump shifts as shown in FIG. 18, gap C is produced between the solder bump 8 and the bonding electrode 2c, thereby preventing an electric short circuit.

In the multi-pin BGA 9 according to the first embodiment, the plural signal bonding electrodes 2k in the regions (first regions 2y) of the upper surface 2a of the multilayer wiring substrate 2 which are opposite to the peripheral areas of the chip are separated into inner and outer ones and the signal through holes 2q coupled to the signal wirings 2u drawn inside are located between the first regions 2y with rows of signal bonding electrodes 2k and the center second region 2z with core power supply bonding electrodes 2m and GND bonding electrodes 2n, permitting chip pads to be arranged densely.

In other words, due to the adoption of a thin coreless substrate for the multilayer wiring substrate 2, the diameter of through holes 2d in the second region 2z under the chip and the through hole pitch can be small enough to obtain space for the formation of plural signal through holes $2q$ between the first regions $2y$ and second region $2z$ of the upper surface $2a$ (first wiring layer L1).

As a consequence, the signal bonding electrodes $2k$ in the first regions $2y$ can be separated into inner and outer ones and the chip pad pitch can be thus decreased and the signal bonding electrodes $2k$ can be disposed for peripheral arrangement (in the first regions $2y$) and the core power supply bonding electrodes $2m$ and GND bonding electrodes $2n$ can be disposed for area arrangement (in the second region $2z$).

Consequently, chip size can be reduced without an increase in the number of layers in the multilayer wiring substrate 2.

Since a multi-pin structure is realized without using a redistribution technique and increasing the number of layers in the multilayer wiring substrate 2, the cost of the multi-pin BGA 9 can be decreased and the need for chip shrinkage can be met. Generally a flip-chip semiconductor device is more costly than a wire-bonded semiconductor device. In this sense, it is very meaningful that the cost of the BGA 9 according to the first embodiment as a flip-chip semiconductor device is reduced.

Furthermore, since area arrangement of electrode pads is can be made without using a redistribution technique, it is easy to design the chip.

Furthermore, in the multilayer wiring substrate 2, since the through hole diameter is decreased, the core power supplies in the second region $2z$ are coupled through the core power supply through holes $2r$ to the core power supply lands $2j$ in the fourth wiring layer L4, so more pins can be provided without an increase in the number of wiring layers to realize a multi-pin structure.

Since area arrangement of electrode pads $1c$ of the semiconductor chip 1 is possible, area arrangement of electrode pads $1c$ of the semiconductor chip 1 can be made even in the multi-pin semiconductor device with a shrunk chip.

Furthermore, since area arrangement of electrode pads $1c$ of the semiconductor chip 1 can be made even in the multi-pin semiconductor device with a shrunk chip, a plurality of core power supply bonding electrodes $2m$ can be arranged in the second region $2z$ near the center of the semiconductor chip 1, so power supply stabilization can be achieved in the multi-pin BGA 9 with a shrunk chip.

Particularly, if the BGA 9 is intended for a high power device, such power supply stabilization is very advantageous.

Next, variations of the first embodiment will be described.

FIG. 19 is a fragmentary enlarged sectional view of the wiring substrate built in the semiconductor device according to a first variation of the first embodiment of the invention. The multilayer wiring substrate 2 of the first variation as shown in FIG. 19 is an wiring substrate with a core layer $2h$, in which the thickness of the substrate is thin since the core layer $2h$ is thin.

In the multilayer wiring substrate 2 with a thin core layer $2h$ as shown in FIG. 19, due to the thinness of the core layer $2h$, small-diameter through holes can be made using a small-diameter drill, so it is possible to make through holes $2d$ whose diameter and pitch are almost as small as those of the through holes of a coreless substrate.

As a consequence, even the semiconductor device which uses the multilayer wiring substrate 2 with a core layer $2h$ can achieve almost the same advantageous effect as the semiconductor device which uses the coreless multilayer wiring substrate 2. For example, the thickness of the multilayer wiring substrate 2 with the core layer $2h$ is about 0.4 mm to 0.6 mm or so; this substrate has an improved rigidity though its thickness is larger than the coreless substrate described above. It is assumed here that a thin multilayer wiring substrate 2 with a core layer $2h$ refers to a multilayer wiring substrate with a core layer $2h$ having a thickness not less than 0.4 and not more than 1.0 mm. Such a thin multilayer wiring substrate 2 with a core layer $2h$ is used, for example, as an in-vehicle semiconductor package substrate which is relatively large (20-35 mm square) and should be highly reliable.

The abovementioned coreless substrate according to the first embodiment which has a relatively small package size (10-20 mm square) is used as a semiconductor package substrate for a mobile device such as a mobile phone.

Figure 20:
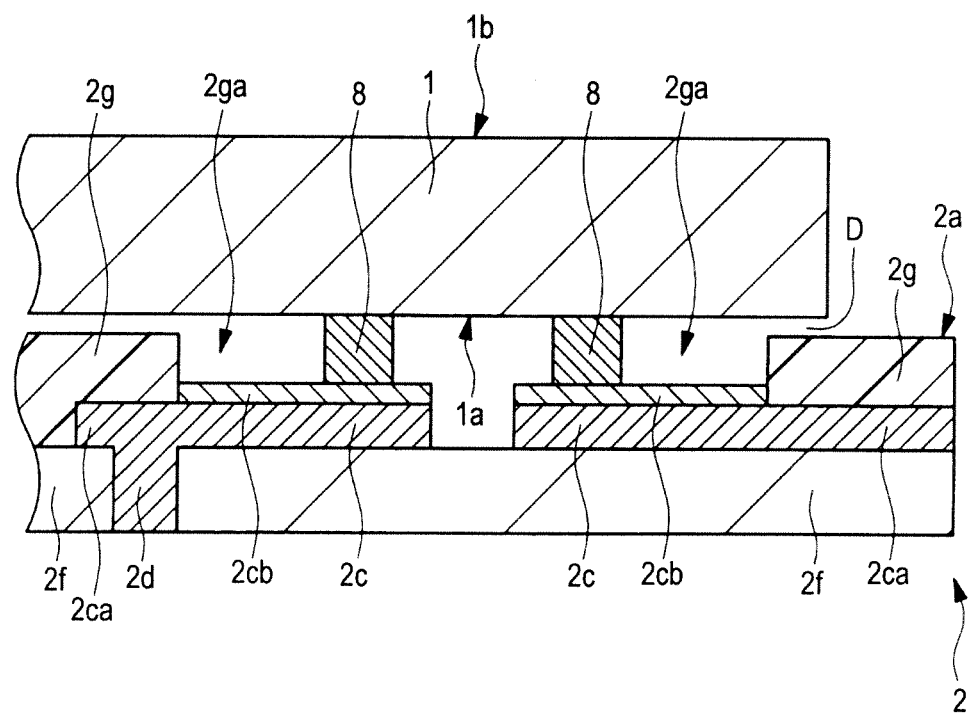
FIG. 20 is a fragmentary enlarged sectional view of the wiring substrate built in the semiconductor device according to a second variation of the first embodiment.

Next, FIG. 20 is a fragmentary enlarged sectional view of the wiring substrate built in the semiconductor device according to a second variation of the first embodiment of the invention. In the flip-chip structure of the semiconductor device of the second variation as shown in FIG. 20, gap D between the semiconductor chip 1 and the solder resist film $2g$ of the multilayer wiring substrate 2 is as small as 5 μm and underfill resin 6 (FIG. 2) is not filled therein because it may be difficult to fill the underfill resin 6 therein.

Since no underfill resin 6 is used, the problem of inhomogeneous filling of underfill resin 6 is eliminated. Here, a plating layer $2cb$ of nickel-gold or the like lies on the surface of a wiring portion $2ca$.

Figure 21:
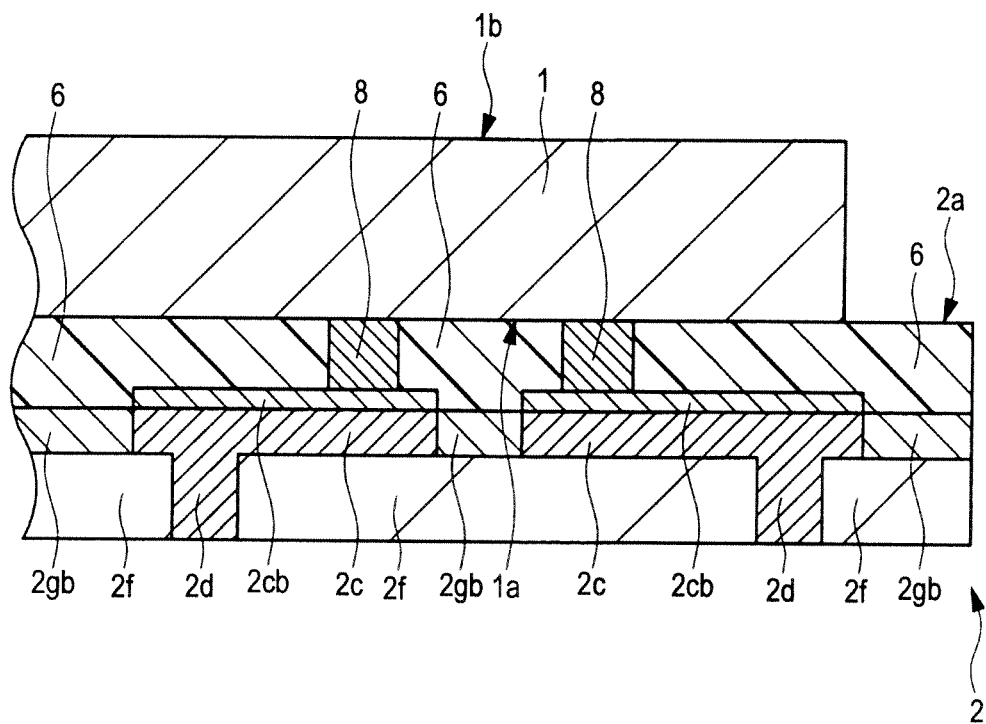
FIG. 21 is a fragmentary enlarged sectional view of the wiring substrate built in the semiconductor device according to a third variation of the first embodiment.

Next, FIG. 21 is a fragmentary enlarged sectional view of the wiring substrate built in the semiconductor device according to a third variation of the first embodiment of the invention. The flip-chip structure of the semiconductor device of the third variation as shown in FIG. 21 has no solder resist film $2g$ as shown in FIG. 20 in the multilayer wiring substrate 2; instead it has an insulating film $2gb$ with a height equivalent to the height of the wiring portion $2ca$ to planarize the substrate surface.

Here, the gap between the multilayer wiring substrate 2 and the main surface $1a$ of the semiconductor chip 1 is as wide as 15 μm or so and this gap is filled with underfill resin 6.

The gap between the multilayer wiring substrate 2 and the main surface $1a$ of the semiconductor chip 1 is wide enough to reduce the possibility of inhomogeneous filling of underfill resin 6.

Figure 22:
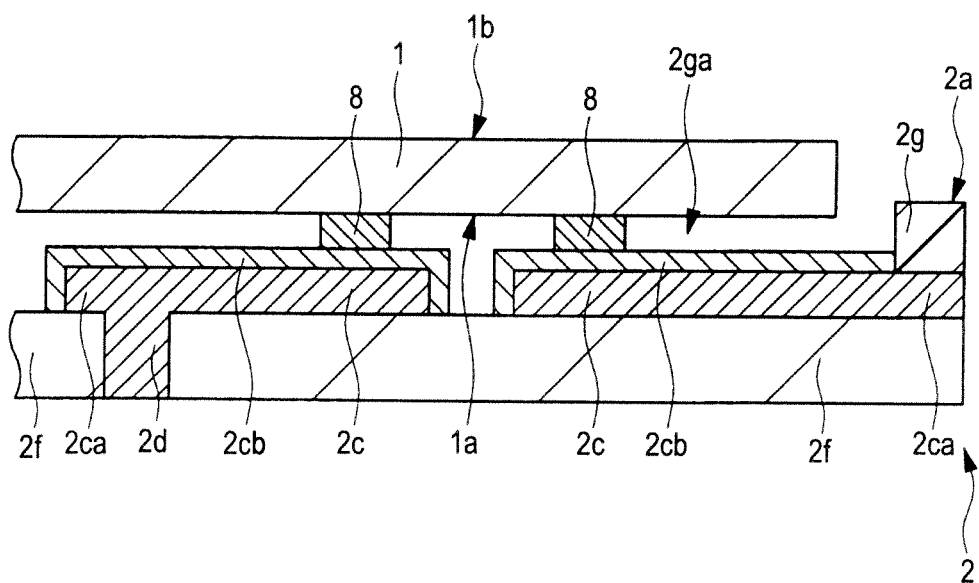
FIG. 22 is a fragmentary enlarged sectional view of the wiring substrate built in the semiconductor device according to a fourth variation of the first embodiment.

Next, FIG. 22 is a fragmentary enlarged sectional view of the wiring substrate built in the semiconductor device according to a fourth variation of the first embodiment of the invention. In the flip-chip structure of the semiconductor device of the fourth variation shown in FIG. 22, the solder resist film $2g$ lies not all over the chip mounting area of the upper surface $2a$ of the multilayer wiring substrate 2, namely the solder resist film $2g$ lies only outside the chip mounting area. In this case, a plating layer $2cb$ of nickel-gold or the like is formed all over the exposed portion of each wiring portion $2ca$.

As a consequence, the gap between the multilayer wiring substrate 2 and the main surface $1a$ of the semiconductor chip 1 is wider, thereby reducing the possibility of inhomogeneous filling of the underfill resin 6.

Figure 23:
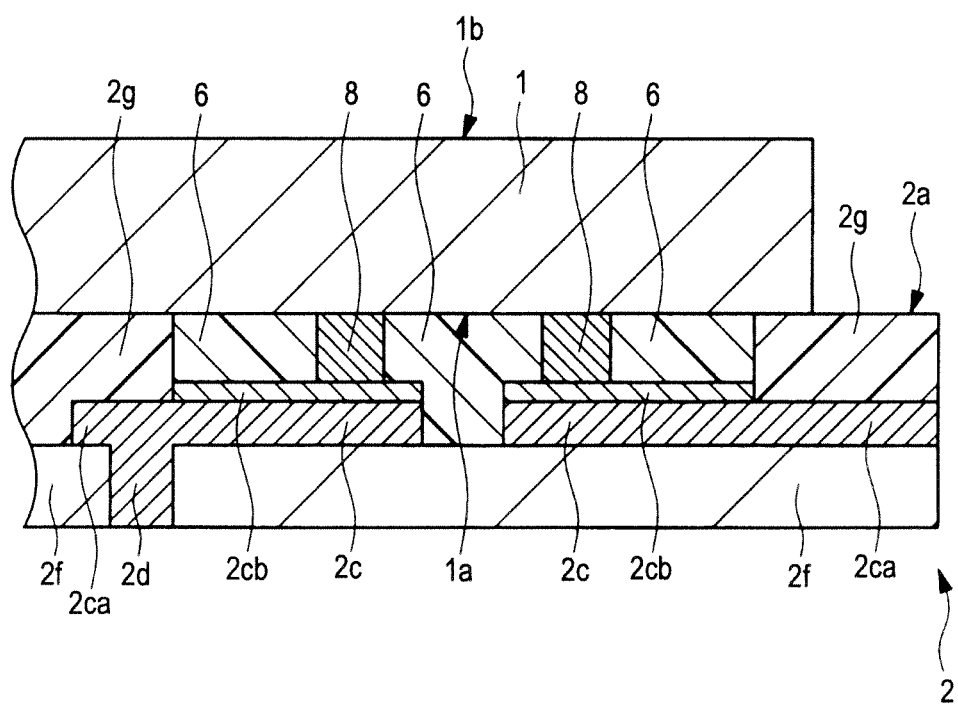
FIG. 23 is a fragmentary enlarged sectional view of the wiring substrate built in the semiconductor device according to a fifth variation of the first embodiment.

Next, FIG. 23 is a fragmentary enlarged sectional view of the wiring substrate built in the semiconductor device according to a fifth variation of the first embodiment of the invention. The flip-chip structure of the semiconductor device of the fifth variation shown in FIG. 23 is produced as follows: after a semiconductor chip 1 with solder bumps 8 is placed on bonding electrodes $2c$, the solder bumps are melted, then underfill resin 6 is filled there, and heat is applied to harden the underfill resin 6.

This reduces the possibility of inhomogeneous filling of the underfill resin 6.

Figure 24:
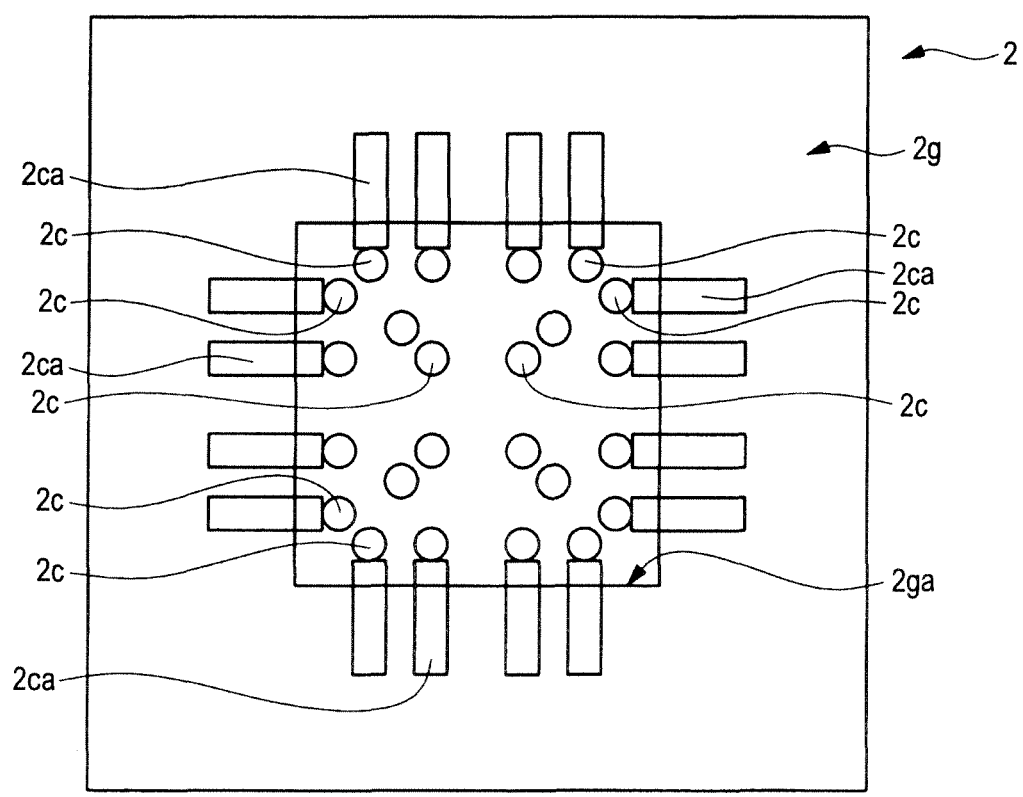
FIG. 24 is a plan view of the wiring substrate built in the semiconductor device according to a sixth variation of the first embodiment.
Figure 25:
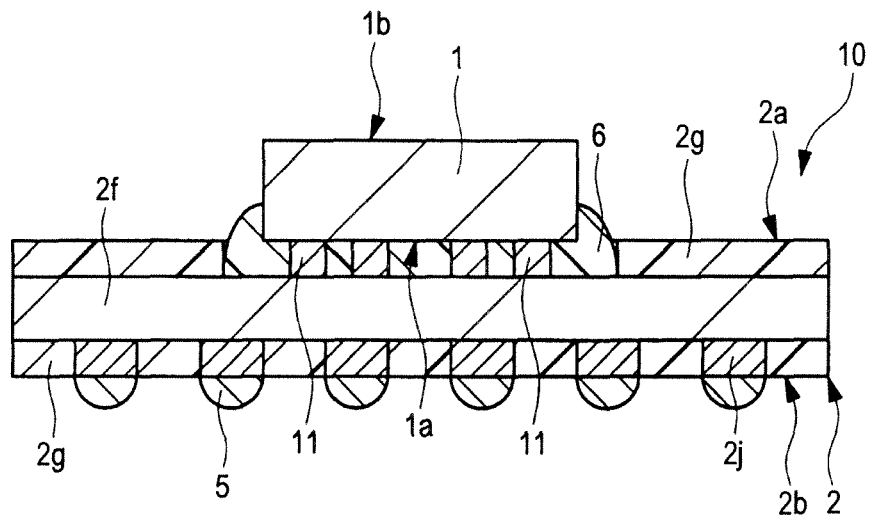
FIG. 25 is a sectional view of an example of the semiconductor device using the wiring substrate shown in FIG. 24.

Next, FIG. 24 is a plan view of the wiring substrate built in the semiconductor device according to a sixth variation of the first embodiment of the invention and FIG. 25 is a sectional view of an example of the semiconductor device using the wiring substrate shown in FIG. 24. The semiconductor device of the sixth variation shown in FIG. 25 is a BGA 10 which uses gold bumps 11 for flip-chip coupling, with the surfaces of the bonding electrodes 2c (FIG. 24) tinned.

As shown in FIG. 24, like the multilayer wiring substrate 2 shown in FIG. 22, the solder resist film 2g lies on the upper surface 2a of the multilayer wiring substrate 2 (FIG. 25) except the chip mounting area, specifically the solder resist film 2g is formed around the chip mounting area. Therefore, in the BGA 10 as well, the underfill resin is filled homogeneously as shown in FIG. 25. An opening 2ga in the solder resist film 2g can stop a flow of underfill resin 6.

Figure 26:
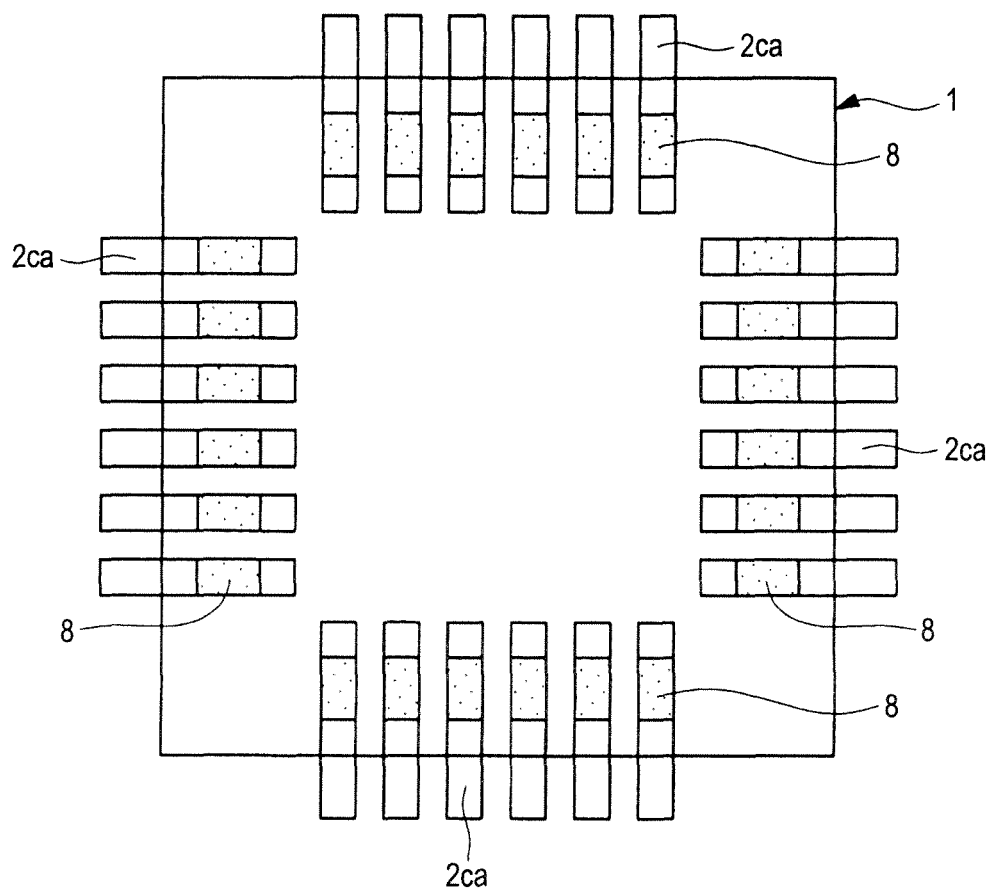
FIG. 26 is a plan view showing an example of the relation between the bonding electrode shape of the wiring substrate and the electrode pads of the semiconductor chip in the semiconductor device according to a seventh variation of the first embodiment.

Next, FIG. 26 is a plan view showing an example of the relation between the bonding electrode shape of the wiring substrate and the electrode pads of the semiconductor chip in the semiconductor device according to a seventh variation of the first embodiment of the invention. In the semiconductor device of the seventh variation shown in FIG. 26, the shape of the solder bumps 8 of the multilayer wiring substrate 2 for flip-chip coupling is a rectangle along the direction in which the wiring portions 2ca to be coupled to the solder bumps 8 extend.

As a consequence, even if the wiring portions 2ca are as thin as 20 μm, the solder bumps 8 can be adequately coupled to them for flip-chip coupling.

Figure 27:
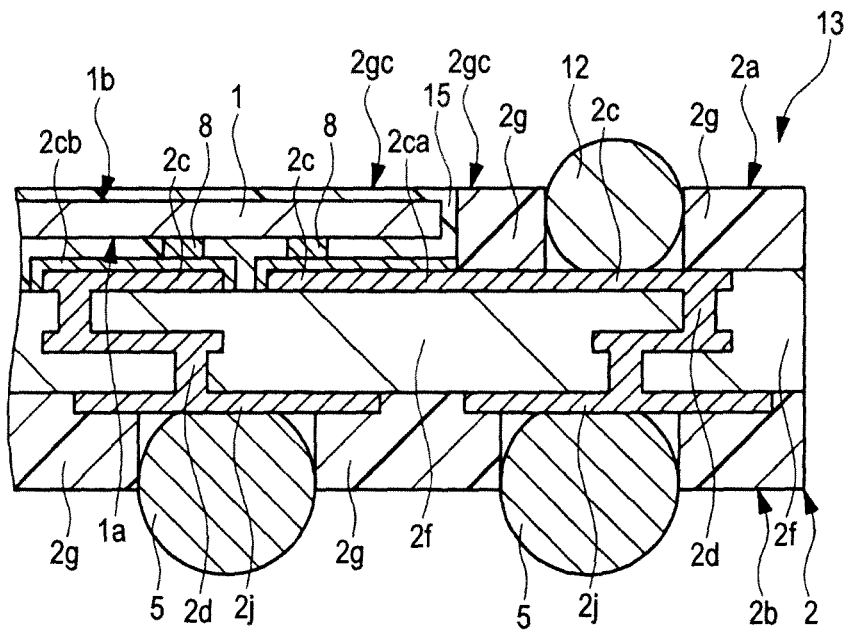
FIG. 27 is a fragmentary enlarged sectional view of the semiconductor device according to an eighth variation of the first embodiment.

Next, FIG. 27 is a fragmentary enlarged sectional view of the semiconductor device according to an eighth variation of the first embodiment of the invention. The semiconductor device of the eighth variation shown in FIG. 27 is a BGA 13 in which the semiconductor chip 1 is thin and solder bumps 12 for stacking are laid around the semiconductor chip 1 on the upper surface 2a of the multilayer wiring substrate 2 and coupled to the bonding electrodes 2c.

In the BGA 13, due to the thinness of the semiconductor chip 1, encapsulating resin can flow to the back surface 1b of the semiconductor chip 1 so that the semiconductor chip 1 is buried in an encapsulant 15, namely the multilayer wiring substrate 2 houses the chip. The upper surface 2gc which connects the encapsulant 15 covering the semiconductor chip 1 and the solder resist film 2g is planarized so that the solder bumps 12 for stacking protrude from the upper surface 2gc.

Figure 28:
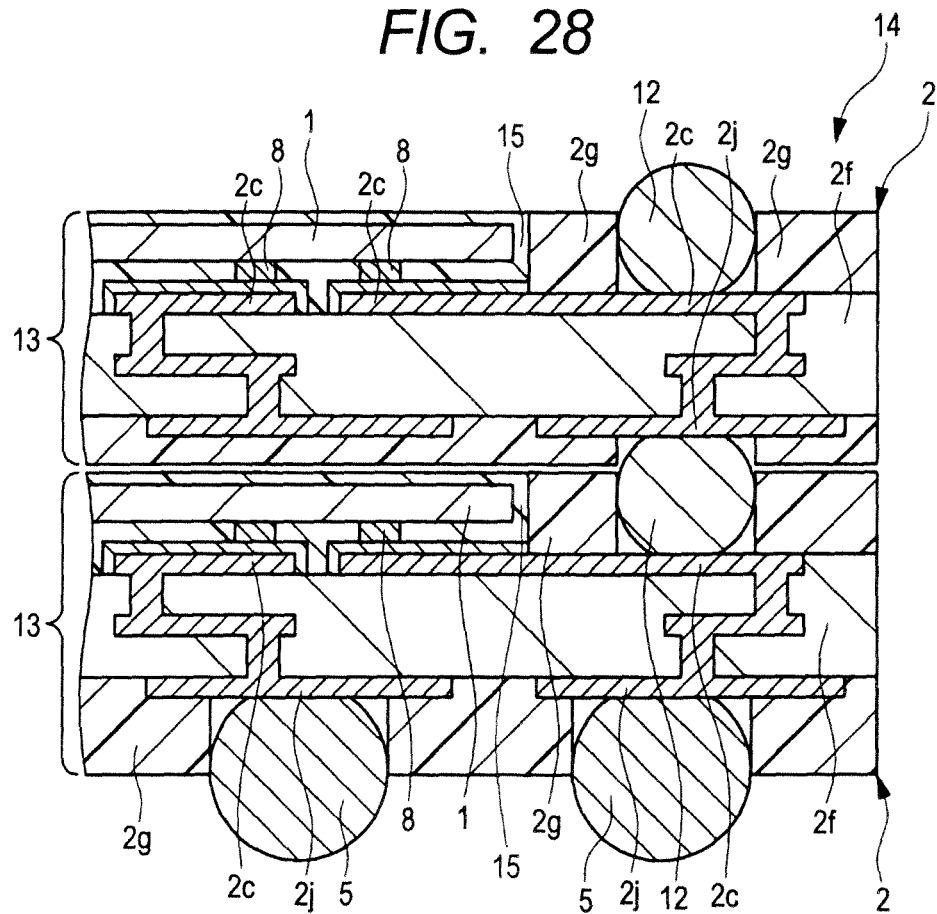
FIG. 28 is a fragmentary enlarged sectional view of the semiconductor device according to a ninth variation of the first embodiment.

FIG. 28 is a fragmentary enlarged sectional view of the semiconductor device according to a ninth variation of the first embodiment of the invention. The semiconductor device of the ninth variation shown in FIG. 28 is a POP (Package On Package) 14 which has two units of the BGA 13 shown in FIG. 28 stacked one upon the other.

In other words, a BGA 13 which houses a thin semiconductor chip 1 is produced and two or more units of the BGA 13 are stacked to make up a POP 14.

Second Embodiment

Figure 29:
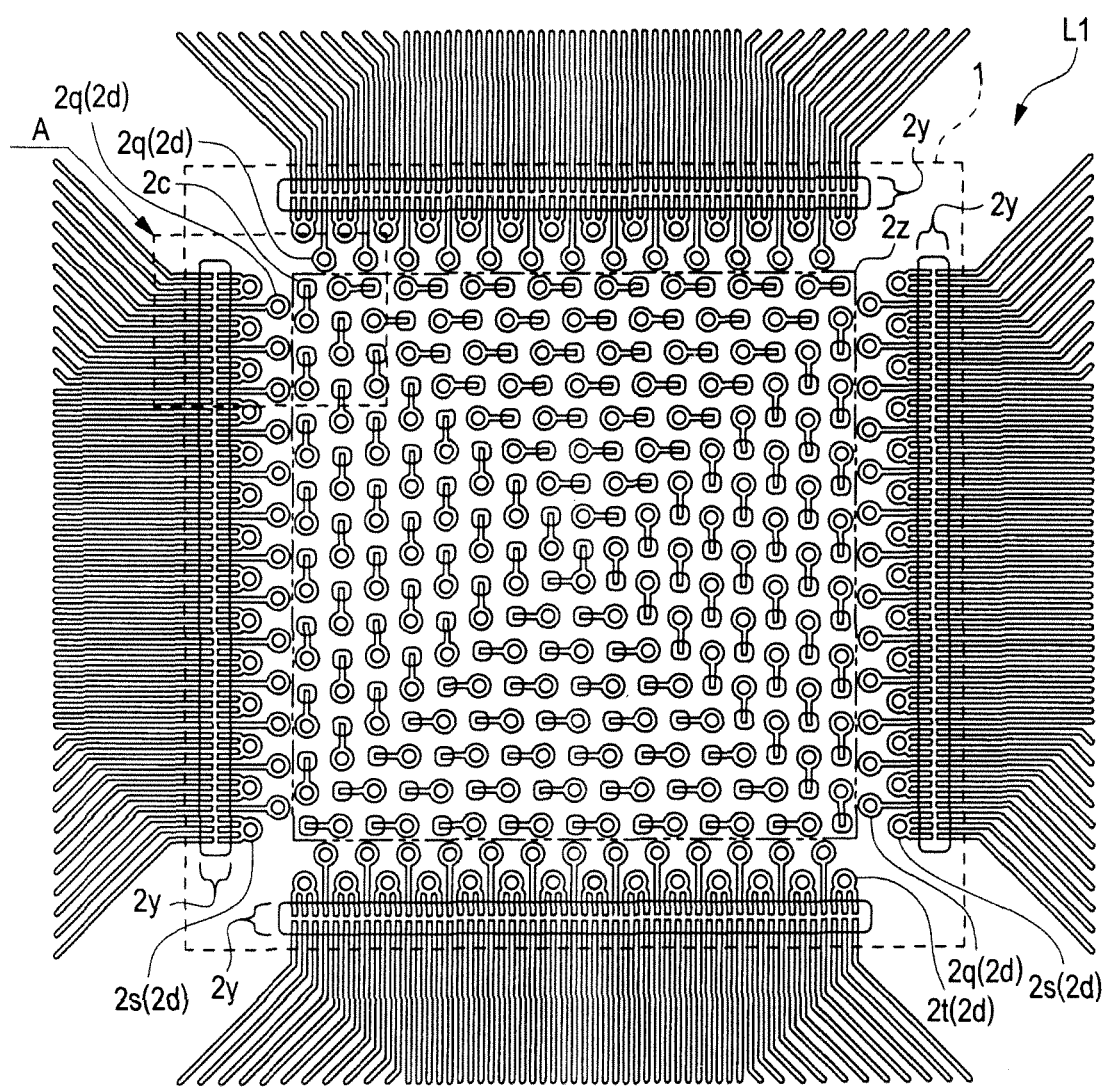
FIG. 29 is a plan view of an example of the wiring pattern of the area under the chip and its vicinity in the first wiring layer (L1) of the wiring substrate built in the semiconductor device according to a second embodiment of the invention.
Figure 30:
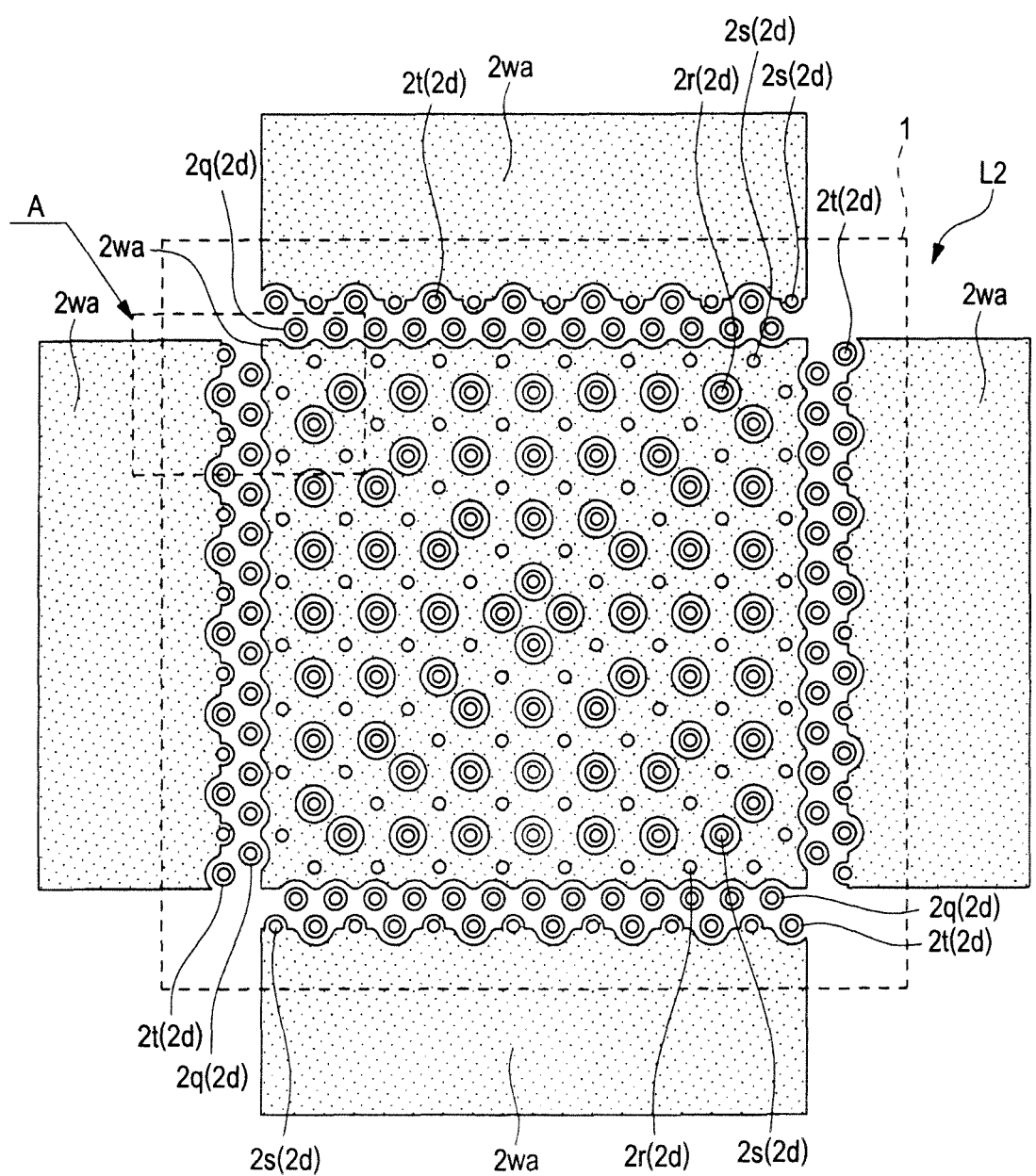
FIG. 30 is a plan view of an example of the wiring pattern of the area under the chip and its vicinity in the second wiring layer (L2) of the wiring substrate built in the semiconductor device according to the second embodiment.
Figure 31:
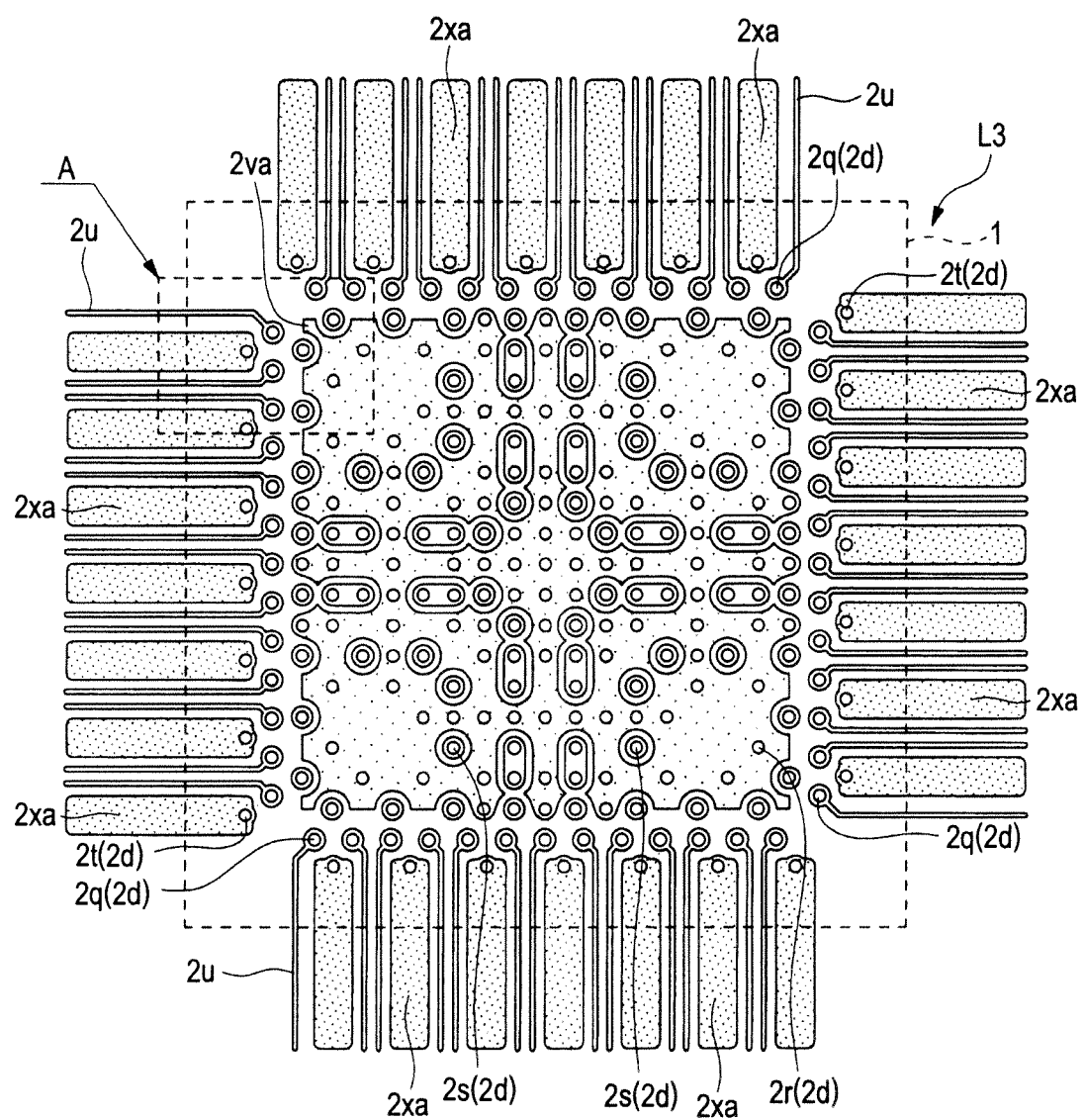
FIG. 31 is a plan view of an example of the wiring pattern of the area under the chip and its vicinity in the third wiring layer (L3) of the wiring substrate built in the semiconductor device according to the second embodiment.
Figure 32:
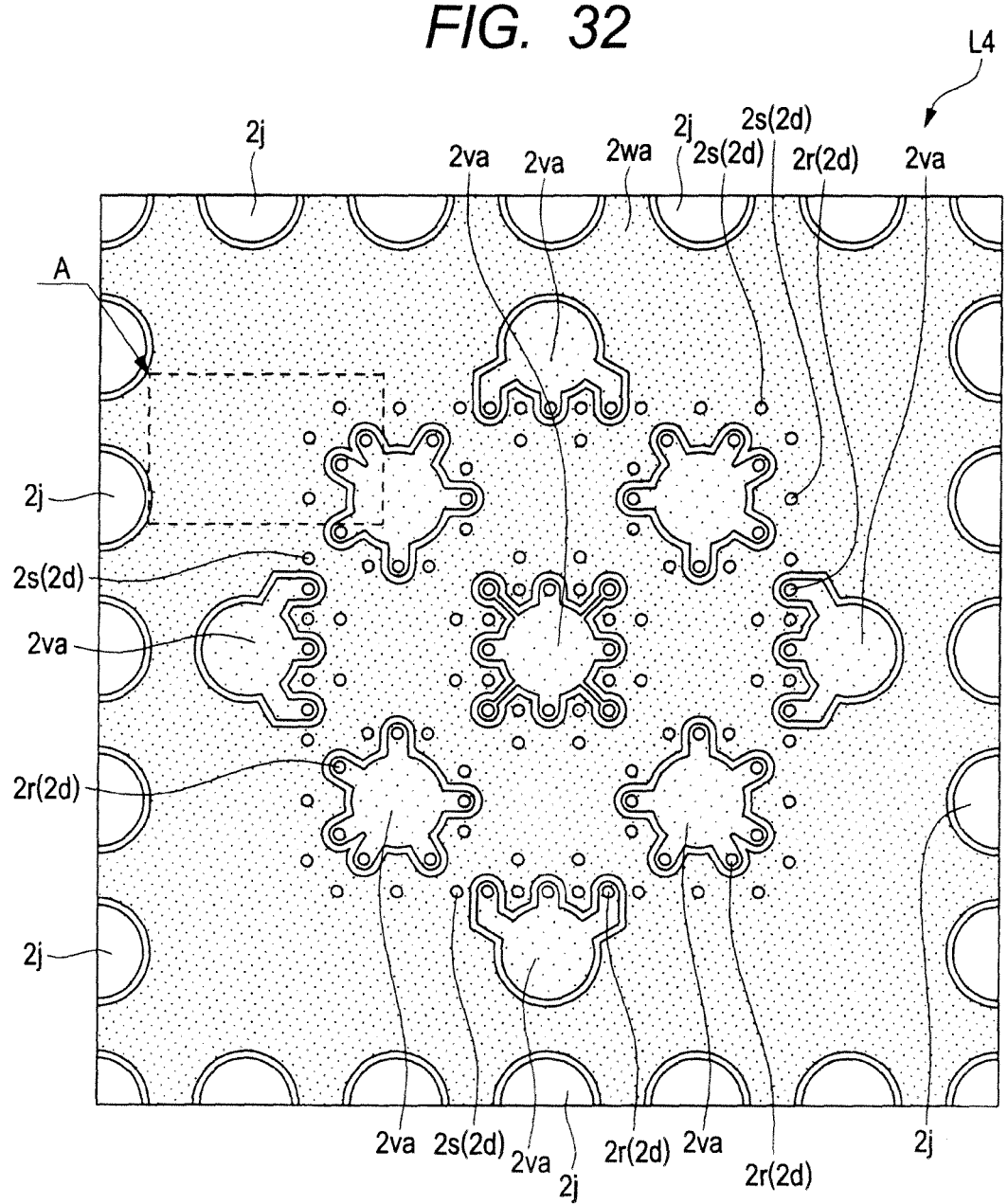
FIG. 32 is a plan view of an example of the wiring pattern of the area under the chip and its vicinity in the fourth wiring layer (L4) of the wiring substrate built in the semiconductor device according to the second embodiment.
Figure 33:
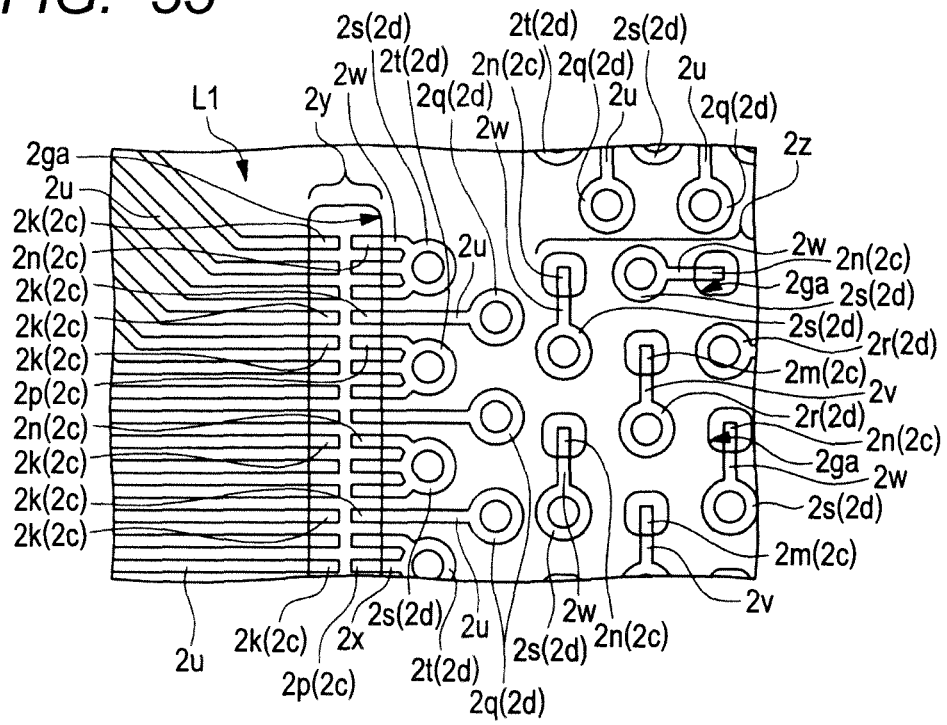
FIG. 33 is a fragmentary enlarged plan view of part A of FIG. 29.
Figure 34:
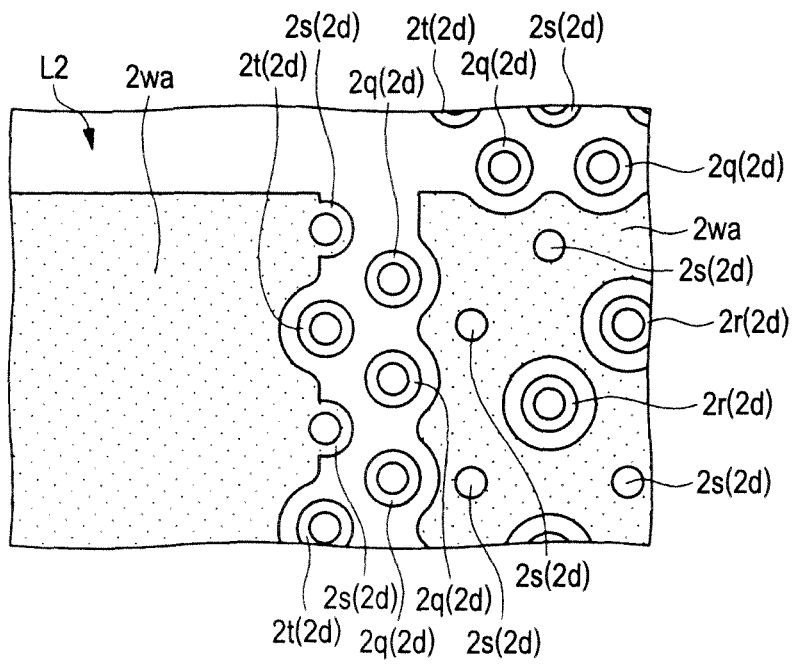
FIG. 34 is a fragmentary enlarged plan view of part A of FIG. 30.
Figure 35:
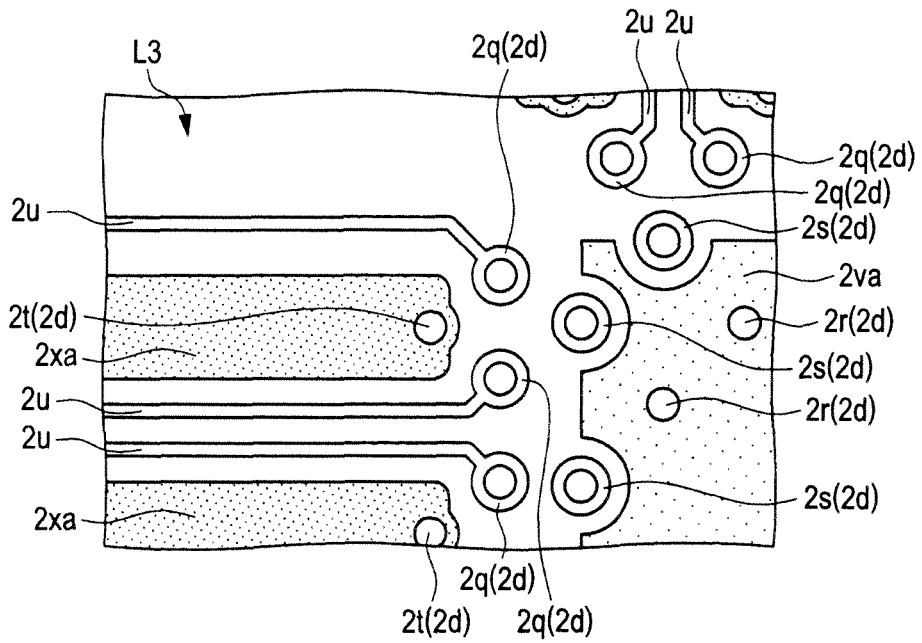
FIG. 35 is a fragmentary enlarged plan view of part A of FIG. 31.
Figure 36:
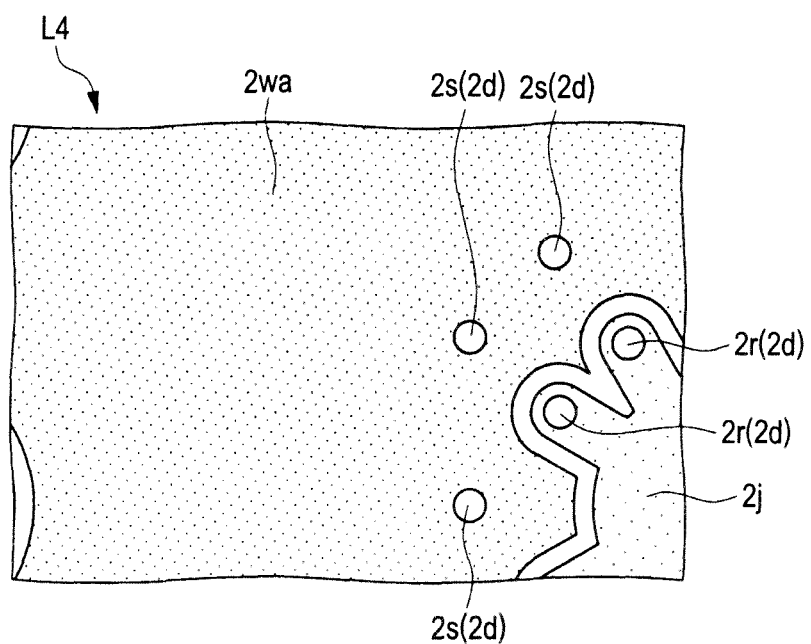
FIG. 36 is a fragmentary enlarged plan view of part A of FIG. 32.
Figure 37:
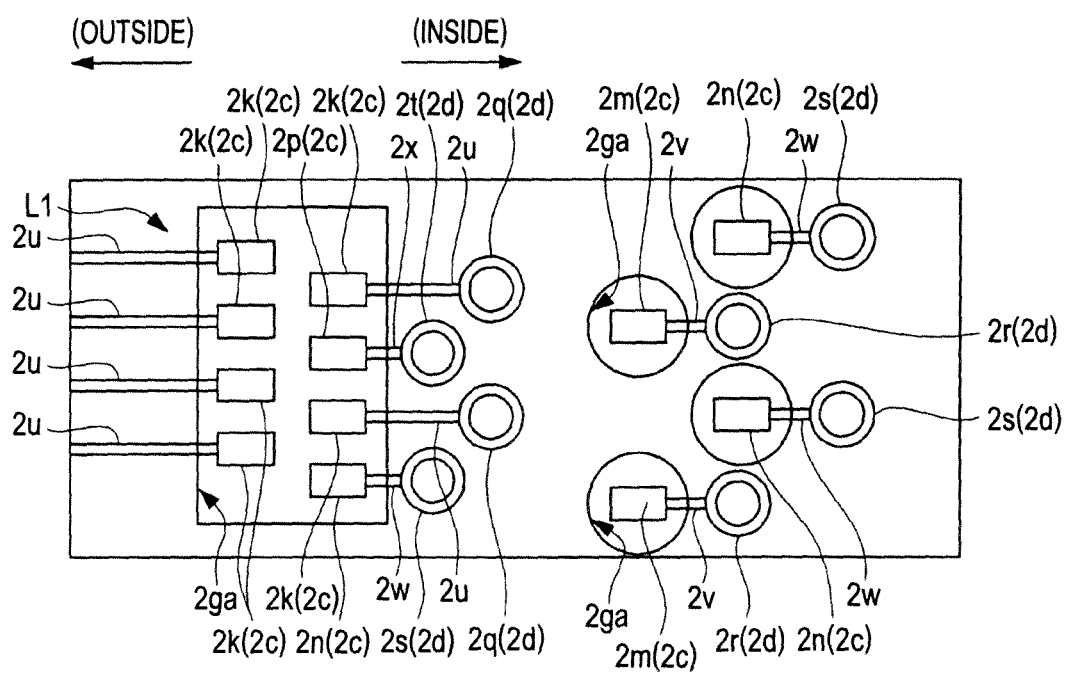
FIG. 37 is a fragmentary enlarged plan view of part A of the wiring substrate built in the semiconductor device according to a variation of the second embodiment.

FIG. 29 is a plan view of an example of the wiring pattern of the area under the chip and its vicinity in the first wiring layer (L1) of the wiring substrate built in the semiconductor device according to a second embodiment of the invention; FIG. 30 is a plan view of an example of the wiring pattern of the area under the chip and its vicinity in the second wiring layer (L2) of the wiring substrate built in the semiconductor device according to the second embodiment; FIG. 31 is a plan view of an example of the wiring pattern of the area under the chip and its vicinity in the third wiring layer (L3) of the wiring substrate built in the semiconductor device according to the second embodiment of the invention; and FIG. 32 is a plan view of an example of the wiring pattern of the area under the chip and its vicinity in the fourth wiring layer (L4) of the wiring substrate built in the semiconductor device according to the second embodiment. FIG. 33 is a fragmentary enlarged plan view of part A of FIG. 29; FIG. 34 is a fragmentary enlarged plan view of part A of FIG. 30; FIG. 35 is a fragmentary enlarged plan view of part A of FIG. 31; FIG. 36 is a fragmentary enlarged plan view of part A of FIG. 32; and FIG. 37 is a fragmentary enlarged plan view of part A of the wiring substrate built in the semiconductor device according to a variation of the second embodiment.

The second embodiment concerns a semiconductor device having a multilayer wiring substrate 2 in which the number of pins is smaller than in the BGA 9 according to the first embodiment. In the second region 2z of the first wiring layer L1 of the multilayer wiring substrate 2, the number of core power supply bonding electrodes 2m and the number of GND bonding electrodes 2n as shown in FIG. 33 are smaller than in the first embodiment, resulting in a decrease in the number of pins of the semiconductor device. Specifically, the number of bonding electrodes 2c (core power supply bonding electrodes 2m and GND bonding electrodes 2n) in the second region 2z of the first wiring layer L1 is smaller than the number of bonding electrodes 2c in the second region 2z of the multilayer wiring substrate 2 of the BGA 9 according to the first embodiment.

Next, the four wiring layers of the multilayer wiring substrate 2 in the second embodiment will be each described referring to FIGS. 29 to 36.

FIGS. 29 and 33 illustrate the wiring pattern of the first wiring layer L1; FIGS. 30 and 34 illustrate that of the second wiring layer L2; FIGS. 31 and 35 illustrate that of the third wiring layer L3 ; and FIGS. 32 and 36 illustrate that of the fourth wiring layer L4. In these figures, the wiring pattern of each first region 2y and that of the area between each first regions 2y and the second region 2z are the same as in the multilayer wiring substrate 2 according to the first embodiment.

The difference from the first embodiment is that in the wiring pattern of the first wiring layer L1 shown in FIG. 29, the number of bonding electrodes 2c in the second region 2z is smaller than in the first embodiment, resulting in a decrease in the number of pins of the semiconductor device. As shown in FIG. 33, the GND bonding electrodes 2n in the second region 2z are electrically coupled to a GND plane 2wa in the second wiring layer L2 shown in FIGS. 30 and 34 through GND wirings 2w and GND through holes 2s.

On the other hand, the core power supply bonding electrodes 2m in the second region 2z of the first wiring layer L1 are electrically coupled to core power supply planes 2va in the third wiring layer L3 shown in FIGS. 31 and 35 through core power supply wirings 2v and core power supply through holes 2r.

Furthermore, as shown in FIGS. 32 and 36, in the fourth wiring layer L4, there are a GND plane 2wa electrically coupled to the GND plane 2wa in the second wiring layer L2 through the GND through holes 2s, and a plurality of core power supply planes 2va (2j) coupled to the core power supply plane 2va in the third wiring layer L3 through the core power supply through holes 2r, along with lands 2j for GND, power supply and signals which are electrically coupled to the relevant planes.

As in the multilayer wiring substrate 2 according to the first embodiment, in the multilayer wiring substrate 2 according to the second embodiment as well, among the wirings for the signal bonding electrodes 2k in the first regions 2y of the first wiring layer L1, the signal wirings 2u in the third wiring layer L3 (another layer) electrically coupled to the signal wirings 2u drawn inside through the signal through holes 2q are drawn outside in the third wiring layer L3. Therefore, the signal through holes 2q are all located outside the second region 2z in the first wiring layer L1.

In the third wiring layer L3, the signal wirings 2u are arranged in pairs and oblong IO power supply planes 2xa are located on both sides of each pair of signal wirings 2u.

Like the BGA 9 according to the first embodiment, the semiconductor device according to the second embodiment is a multi-pin semiconductor device. In this semiconductor device, in order to arrange, in a small number of wiring layers, signal wirings 2u to be connected to a desired number of signal pins, signal through holes 2q are also provided inside the first regions 2y (between the first regions 2y and second region 2z) so as to permit the signal wirings 2u to be drawn outside in another wiring layer (in this case, the third wiring layer L3), because the number of signal wirings 2u arranged only outside the first regions 2y in the first wiring layer L1 is insufficient. This device structure permits a lot of pins to be arranged in a small number of wiring layers.

For this purpose, the device uses a thin substrate such as a coreless substrate so that the diameter of through holes 2d in the second region 2z under the chip and the through hole pitch can be small enough to obtain space for the formation of signal through holes 2q between the first regions 2y and second region 2z of the first wiring layer L1. The presence of signal through holes 2q between the first regions 2y and second region 2z makes it possible to realize a semiconductor device in which a lot of pins are arranged in a small number of wiring layers.

The other details of the wiring patterns of the first wiring layer L1, second wiring layer L2, third wiring layer L3, and fourth wiring layer L4 in the second embodiment are the same as those in the first embodiment and description thereof is omitted here.

The advantageous effect achieved by the semiconductor device having the multilayer wiring substrate 2 according to the second embodiment is the same as that achieved by the semiconductor device (BGA 9) according to the first embodiment and description thereof is omitted here.

Next, a variation of the second embodiment will be described.

FIG. 37 shows the structure of an wiring substrate as a variation of the second embodiment, in which a plurality of bonding electrodes 2c in each first region 2y of the first wiring layer L1 are arranged in a staggered pattern. Specifically, the two rows of bonding electrodes 2c in each first region 2y of the first wiring layer L1 are arranged in a staggered pattern. In this case, the two rows of electrode pads 1c in the peripheral areas of the main surface 1a of the semiconductor chip 1 are also arranged in a staggered pattern so as to permit flip-chip coupling.

This arrangement makes it possible that in the wiring pattern of the multilayer wiring substrate 2, the pitch between bonding electrodes 2c can be 20 μm at a line/space ratio of 20 μm/20 μm. As a consequence, the pad pitch can be decreased and the number of pins in the semiconductor device can be increased.

The invention made by the present inventors has been so far explained in reference to the preferred embodiments thereof. However, the invention is not limited thereto and it is obvious that these details may be modified in various ways without departing from the spirit and scope thereof.

For example, although the first embodiment has been described on the assumption that the bonding electrodes 2c in the first regions 2y in the peripheral areas of the upper surface 2a of the multilayer wiring substrate 2 are arranged in parallel (not staggered), the bonding electrodes 2c in the first regions 2y (including the second region 2z) of the upper surface 2a may also be arranged in a staggered pattern in the multilayer wiring substrate 2 of the BGA 9 according to the first embodiment.

If the bonding electrodes 2c in the first regions 2y of the upper surface 2a of the multilayer wiring substrate 2 of the BGA 9 according to the first embodiment are arranged in a staggered pattern, in the BGA 9 the pad pitch can be further decreased and the number of pins can be further increased.

Although the first embodiment has been described on the assumption that the stiffener ring 7 is attached to the BGA 9, the stiffener ring 7 is omissible. If the stiffener ring 7 is not attached, the heat spreader 4 is bonded only to the back surface 1b of the semiconductor chip 1 through heat-radiating resin 3 or the like.

The present invention is suitable for electronic devices which adopt a flip-chip coupling method.

What is claimed is:

1. A semiconductor device comprising:
a multilayer wiring substrate having a first layer and a second layer, bonding electrodes arranged over a first main surface of the first layer, external terminals arranged over a second main surface of the second layer which faces a direction opposite a direction which the first main surface faces; and
a semiconductor chip having an obverse surface over which electrode pads are arranged and a reverse surface opposite the obverse surface, the semiconductor chip being mounted over the first main surface of the multilayer wiring substrate such that the obverse surface of the semiconductor chip faces the first main surface of the multilayer wiring substrate, each of the electrode pads of the semiconductor chip is electrically connected to each of the bonding electrodes of the multilayer wiring substrate via a conductive material,
wherein, in plan view, first bonding electrodes and second bonding electrodes located inside the first bonding electrodes among the bonding electrodes are arranged in a first region of the first main surface of the multilayer wiring substrate,
wherein, in plan view, third bonding electrodes among the bonding electrodes are arranged in a second region located inside the first region,
wherein all of the first bonding electrodes are signal bonding electrodes,
wherein the second bonding electrodes include signal bonding electrodes, first power supply bonding electrodes, and first ground (GND) bonding electrodes,
wherein the third bonding electrodes include second power supply bonding electrodes and second ground (GND) bonding electrodes,
wherein, in plan view, each of first wirings drawn from each of the first bonding electrodes extends toward an outside of the multilayer wiring substrate,
wherein, in plan view, each of second wirings drawn from each of the second bonding electrodes extends toward an inside of the multilayer wiring substrate,
wherein each of the second wirings drawn from the signal bonding electrodes among the second bonding electrodes is electrically connected to a first wiring portion in a different layer from the first layer via a first through hole,
wherein each of the second wirings drawn from the first power supply bonding electrodes among the second bonding electrodes is electrically connected to a second wiring portion in the different layer from the first layer via a second through hole, wherein each of the second wirings drawn from the first ground (GND) bonding electrodes among the second bonding electrodes is electrically connected to a third wiring portion in the different layer from the first layer via a third through hole, and wherein, in plan view, the first through hole is located between the first and the second regions and the first through hole is located inside the second and third through holes.

2. The semiconductor device according to claim 1,
wherein the first power supply bonding electrodes are Input/Output (IO) power supply bonding electrodes and the second power supply bonding electrodes are core power supply bonding electrodes.

3. The semiconductor device according to claim 1,
wherein, in the plan view, a part of the second wirings electrically connected to the first through holes is located between the second and third through holes.

4. The semiconductor device according to claim 1,
wherein each of the first and second bonding electrodes is arranged along a first direction, and
wherein, in a second direction perpendicular to the first direction, each of the first and second bonding electrodes is arranged in a same position.

5. The semiconductor device according to claim 1,
wherein the multilayer wiring substrate has a third layer between the first and second layer in a thickness direction of the multilayer wiring substrate,
wherein a first ground (GND) plane is formed between the first and third layers, and
wherein the third through hole is electrically connected to the first ground (GND) plane.

6. The semiconductor device according to claim 5,
wherein a first power supply plane is formed between the second and third layers, and
wherein the second through hole is electrically connected to a first power supply plane.

7. The semiconductor device according to claim 5,
wherein the first wiring portion is formed between the second and third layers.

8. The semiconductor device according to claim 5,
wherein a second ground (GND) plane is formed between the first and third layers, and
wherein each of the second ground (GND) bonding electrodes among the third bonding electrodes is electrically connected to the second ground (GND) plane via each of fourth through holes.

9. The semiconductor device according to claim 8,
wherein a second power supply plane is formed between the first and third layers, and
wherein each of the second power supply bonding electrodes among the third bonding electrodes is electrically connected to the second power supply plane via each of fifth through holes.

10. The semiconductor device according to claim 1,
wherein the multilayer wiring substrate has a core layer between the first and second layer in a thickness direction of the multilayer wiring substrate.

11. The semiconductor device according to claim 1,
wherein the conductive material includes solder.

12. The semiconductor device according to claim 1,
wherein the semiconductor chip has first electrode pads and second electrode pads arranged along an outer edge of the semiconductor chip, and
wherein each of the first and second electrode pads corresponds with each of the first and second bonding electrodes of the multilayer wiring substrate.

13. The semiconductor device according to claim 1,
wherein a resin is filled between the obverse surface of the semiconductor chip and the first main surface of the multilayer wiring substrate.

14. The semiconductor device according to claim 1,
wherein solder balls are electrically connected to each of the external terminals of the multilayer wiring substrate.

* * * * *